United States Patent
Itoh et al.

(10) Patent No.: US 9,766,525 B2
(45) Date of Patent: *Sep. 19, 2017

(54) ACTIVE-MATRIX SUBSTRATE AND DISPLAY DEVICE

(71) Applicant: Sharp Kabushiki Kaisha, Osaka (JP)

(72) Inventors: Ryohki Itoh, Osaka (JP); Masahiro Yoshida, Osaka (JP); Takaharu Yamada, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/421,312

(22) Filed: Jan. 31, 2017

(65) Prior Publication Data

US 2017/0139300 A1     May 18, 2017

Related U.S. Application Data

(63) Continuation of application No. 14/774,547, filed as application No. PCT/JP2014/053842 on Feb. 19, 2014, now Pat. No. 9,594,282.

(30) Foreign Application Priority Data

Mar. 12, 2013  (JP) .................... 2013-049473

(51) Int. Cl.
G02F 1/1362  (2006.01)
G02F 1/1343  (2006.01)
(Continued)

(52) U.S. Cl.
CPC ...... *G02F 1/136286* (2013.01); *G02F 1/1368* (2013.01); *G02F 1/133345* (2013.01);
(Continued)

(58) Field of Classification Search
CPC ............. G02F 1/136286; G02F 1/1368; G02F 1/133345; G02F 1/134336; H01L 29/24; H01L 27/1225; H01L 27/124
(Continued)

(56) References Cited

U.S. PATENT DOCUMENTS 5,943,106 A * 8/1999 Sukenori ........... G02F 1/136213
349/192
6,028,577 A * 2/2000 Sakamoto ............ G09G 3/3648
345/92
(Continued)

FOREIGN PATENT DOCUMENTS

JP    H10-39336 A    2/1998
JP    H10-206869 A   8/1998
(Continued)

*Primary Examiner* — Bo Fan
(74) *Attorney, Agent, or Firm* — Chen Yoshimura LLP

(57) ABSTRACT

In an active matrix substrate, each of at least two auxiliary capacitance electrodes contains a first electrode section and a second electrode section, at least a portion of the first electrode sections and at least a portion of a plurality of source bus lines overlap each other, the second electrode section has two linear sections that branch from the first electrode section and that extend in a second direction, a portion of the region between the two linear sections and at least a portion of the plurality of source bus lines overlap each other, and the first and second electrode sections, which are adjacent and arranged in a first direction, are disposed symmetrically to each other about a reference point that is on a straight line passing through a substantially central portion of respective pixels arranged in the first direction.

16 Claims, 14 Drawing Sheets

(51) Int. Cl.
  *G02F 1/1368* (2006.01)
  *G02F 1/1333* (2006.01)
  *H01L 27/12* (2006.01)
  *H01L 29/24* (2006.01)
  *H01L 29/786* (2006.01)

(52) U.S. Cl.
  CPC ...... *G02F 1/134336* (2013.01); *H01L 27/124* (2013.01); *H01L 27/1225* (2013.01); *H01L 27/1248* (2013.01); *H01L 29/24* (2013.01); *H01L 29/7869* (2013.01); *G02F 2201/123* (2013.01); *G02F 2201/40* (2013.01); *G02F 2202/02* (2013.01); *G02F 2202/10* (2013.01)

(58) Field of Classification Search
  USPC .......................... 349/39, 54, 110, 92; 257/43
  See application file for complete search history.

(56) References Cited

U.S. PATENT DOCUMENTS

| | | | |
|---|---|---|---|
| 6,040,882 A * | 3/2000 | Jun .................. | G02F 1/136213 349/111 |
| 7,372,528 B2 | 5/2008 | Jeon et al. | |
| 8,184,222 B2 * | 5/2012 | Kim .................. | G02F 1/136213 349/38 |
| 2004/0246409 A1 * | 12/2004 | Jeon .................. | G02F 1/136213 349/110 |
| 2007/0263134 A1 * | 11/2007 | Kim .................. | G02F 1/136213 349/54 |

FOREIGN PATENT DOCUMENTS

| JP | H10-232408 A | 9/1998 |
|---|---|---|
| JP | 2005-4207 A | 1/2005 |

\* cited by examiner

ACTIVE-MATRIX SUBSTRATE AND DISPLAY DEVICE

TECHNICAL FIELD

The present invention relates to an active matrix substrate and a display device. More specifically, the present invention relates to an active matrix substrate in which auxiliary capacitance electrodes are suitably disposed, and a display device that includes the active matrix substrate.

BACKGROUND ART

Active matrix substrates that include elements such as thin film transistors are widely used as components of electronic devices such as liquid crystal display devices, organic electroluminescent display devices, and solar cells. In active matrix substrates used in conventional liquid crystal display devices, a plurality of scan signal lines (hereafter also referred to as gate bus lines) and a plurality of data signal lines (hereafter also referred to as source bus lines) are disposed so as to intersect on the substrate, thin film transistor elements are provided at each point at which the signal lines intersect, and image signals are sent as appropriate to respective pixel electrodes that are electrically connected to the thin film transistor elements by a switching function of the thin film transistor elements, for example. There are also active matrix substrates on which auxiliary capacitance electrodes are provided on the various pixels. These active matrix substrates are used to prevent degradation of image signals due to self-discharge in the liquid crystal layer or OFF current in the thin film transistor elements while the thin film transistor elements are OFF, and are used as a path or the like for applying various modulated signals during liquid crystal driving. Examples of such active matrix substrates are given below.

Patent Document 1, for example, discloses an array substrate that includes: a transparent substrate; a plurality of switching elements that are formed so as to be separated from the transparent substrate by a first distance and that include a plurality of pixel electrodes, gate electrodes, drain electrodes, and source electrodes arranged in a matrix, the drain electrodes being respectively electrically connected to the respective pixel electrodes; data lines that are separated from the transparent substrate by a second distance, are disposed between the pixel electrodes, are electrically connected to the source electrodes, and are formed at a width with a first length in order to apply a pixel voltage to the pixel electrodes; gate lines that are electrically connected to the gate electrodes and transmit electric signals for turning the switching elements ON and OFF; and a light-shielding pattern that is formed so as to be separated from the transparent substrate by a third distance and that blocks light that is leaked in the space between pixel electrodes.

Patent Document 2, for example, discloses a display device that includes: a first substrate; a second substrate that faces the first substrate; gate lines that are disposed on the first substrate; data lines that intersect the gate lines and that are disposed on the first substrate; storage lines that are disposed on the first substrate and that are separated from the gate lines; pixel electrodes that are disposed in a pixel region; a common electrode that is disposed on the second substrate so as to face the pixel electrodes; main storage electrodes that extend in the same direction as the data lines so as to overlap the pixel electrodes and the data lines and that branch from the storage lines; and a plurality of sub-storage electrodes that branch from the main storage electrodes and that overlap the pixel electrodes, with the plurality of sub-storage electrodes extending in a direction that is substantially parallel to the data lines.

Similarly, Patent Documents 3 to 5, for example, disclose an active matrix liquid crystal display device, a liquid crystal display device, and a liquid crystal panel that include an active matrix substrate on which auxiliary capacitance electrodes have been provided.

RELATED ART DOCUMENTS

Patent Documents

Patent Document 1: Japanese Patent Application Laid-Open Publication No. 2005-4207
Patent Document 2: U.S. Pat. No. 8,184,222 Specification
Patent Document 3: Japanese Patent Application Laid-Open Publication No. H10-39336
Patent Document 4: Japanese Patent Application Laid-Open Publication No. H10-206869
Patent Document 5: Japanese Patent Application Laid-Open Publication No. H10-232408

SUMMARY OF THE INVENTION

Problems to be Solved by the Invention

There have been a variety of problems with active matrix substrates on which auxiliary capacitance electrodes have been provided. These problems include: a decrease in the aperture ratio when the configuration and the arrangement of the auxiliary capacitance electrodes are not optimized; and an increase in power consumption as the capacitance of the sources bus lines increases. In addition, depending on the arrangement of the auxiliary capacitance electrodes, there have been instances where regions in which the aperture ratios within the pixels are different are consecutively aligned in the direction that the gate bus lines extend, and there is thus a decrease in display quality in the borders between these regions.

Conventional active matrix substrates 1001, 1101, and 1201 will be used to explain the above-mentioned problems.

The conventional active matrix substrate 1001 has a configuration (hereafter also referred to as a $\pi$-type auxiliary capacitance electrode configuration) such as that shown in FIG. 16 in which auxiliary capacitance electrodes near the source bus lines are disposed in a $\pi$ shape. A $\pi$-type auxiliary capacitance electrode configuration is a configuration in which an auxiliary capacitance electrode that is branched from an auxiliary capacitance bus line contains a section that extends in the lateral direction (the direction in which the gate bus lines extend, for example) in the shape of the Greek letter $\pi$, and two linear sections that extend in the vertical direction (the direction in which the source bus lines extend, for example) and are substantially orthogonal to the section that extends in the lateral direction. FIG. 16 is a schematic plan view that shows a pixel in a conventional active matrix substrate (a $\pi$-type auxiliary capacitance electrode configuration). FIG. 16 corresponds to FIG. 1 in Patent Document 1 mentioned above.

The conventional active matrix substrate 1101 has a configuration (hereafter referred to as an auxiliary capacitance electrode under source bus line configuration) such as that shown in FIG. 17 in which auxiliary capacitance electrodes are also disposed in a location so as to overlap the source bus lines. FIG. 17 is a schematic plan view that shows a pixel in a conventional active matrix substrate (an auxiliary capacitance electrode under source bus line configuration). FIG. 17 corresponds to FIG. 4 in Patent Document 1 mentioned above.

The conventional active matrix substrate 1201 has a configuration such as that shown in FIG. 18, which is a combination of a π-type auxiliary capacitance electrode configuration and an auxiliary capacitance electrode under source bus line configuration. FIG. 18 is a schematic plan view of a pixel in a conventional active matrix substrate (a combination of a π-type auxiliary capacitance electrode configuration and an auxiliary capacitance electrode under source bus line configuration). FIG. 18 corresponds to FIG. 1 in Patent Document 2 mentioned above.

First, the problem of a decrease in the aperture ratio will be explained using FIG. 16. As shown in FIG. 16, the conventional active matrix substrate 1001 includes: a gate bus line 1002; source bus lines 1003 that extend in a direction that intersects the gate bus line 1002; a thin film transistor element 1004 that is electrically connected to the gate bus line 1002 and the source bus line 1003; and a pixel electrode 1009 that is electrically connected to a drain electrode 1007 of the thin film transistor element 1004. In a pixel such as that shown in FIG. 16, a voltage provided by the source bus line 1003 is applied to the pixel electrode 1009 via a source electrode 1005 and the drain electrode 1007 when the pixel is selected by the gate bus line 1002. The conventional active matrix substrate 1001 also includes: auxiliary capacitance bus lines 1010 that extend in the same direction as the gate bus line 1002; and auxiliary capacitance electrodes 1013 that branch from the auxiliary capacitance bus lines 1010, are disposed in a it shape near the source bus line 1003, and that form an auxiliary capacitance between the auxiliary capacitance electrodes 1013 and the pixel electrode 1009.

A π-type auxiliary capacitance electrode configuration (auxiliary capacitance electrode 1013, for example) is normally used as an anti-shadowing measure to decrease the capacitance between the source bus lines 1003 and the pixel electrode 1009. This is because the auxiliary capacitance electrodes 1013 partially block electric fields generated between the pixel electrode 1009 and the source bus lines 1003. Shadowing is a phenomenon in which a shadow appears alongside displayed characters and patterns in sections where there is a high contrast. Crosstalk is believed to be the cause of driving signals in an active matrix substrate leaking to portions of the substrate that are not being driven, for example.

In liquid crystal display devices that include the conventional active matrix substrate 1001, there are instances in which light leaks from the backlight along the source bus lines 1003 in a region AR17 between the source bus line 1003 and the auxiliary capacitance electrodes 1013, for example. To prevent a decrease in display quality due to such leaks, the width of a light-shielding element (a black matrix of an opposing substrate that faces the active matrix substrate, for example) was increased such that the element was not only disposed in a location so as to face the source bus lines 1003 and the auxiliary capacitance electrode 1013, but also disposed in a location that opposed the location in which light leakage was occurring. This, however, led to another problem: a decrease in the aperture ratio.

The problem of an increase in power consumption will be explained next using FIG. 17. There is only one difference between an active matrix substrate 1101 such as that shown in FIG. 17 and an active matrix substrate 1001 such as that shown in FIG. 16: the active matrix substrate 1101 from FIG. 17 includes auxiliary capacitance bus lines 1110 that extend in the same direction as the gate bus line 1002, and auxiliary capacitance electrodes 1113 that branch from the auxiliary bus lines 1110 and are disposed in a position so as to overlap the source bus lines 1003 and form an auxiliary capacitance between the auxiliary capacitance electrodes 1113 and the pixel electrode 1009. Otherwise, the configuration of the two active matrix substrates 1101, 1001 is identical.

In a liquid crystal display device that includes a conventional active matrix substrate 1001 such as that described above, there are cases in which a liquid crystal display device that includes a conventional active matrix substrate 1101 is used to decrease the width of the light-shielding element and increase the aperture ratio, for example. This is because the light-shielding element positioned so as to oppose the auxiliary capacitance electrodes 1113 can be made narrower by using the auxiliary capacitance electrodes 1113 to block locations where light leakage is occurring and decreasing the width of the auxiliary capacitance electrodes 1113. However, the source bus lines 1003 and the auxiliary capacitance electrodes 1113 overlap, which causes the capacitance between the source bus lines 1003 and the auxiliary capacitance electrodes 1113 to increase. This in turn leads to the problem of increased power consumption. In addition, data signals (image signals) become rounded, which can cause the hues of pixels corresponding to both ends of the source bus lines 1003 to be different and the display quality to decrease, for example.

Therefore, regarding conventional active matrix substrates 1001, 1101 such as those shown in FIGS. 16 and 17, there was room for improvement in adequately controlling increases in capacitance in the source bus lines while increasing the aperture ratio.

Next, the problem of decreased display quality in the borders of regions of pixels in which the aperture ratios of the pixels are different will be explained using FIG. 18. A conventional active matrix substrate 1201 such as that in FIG. 18 has the same configuration as the conventional active matrix substrate 1001 shown in FIG. 16, except that the substrate 1201 includes an auxiliary capacitance bus line 1210 that extends in the same direction as a gate bus line 1002, and an auxiliary capacitance electrode 1213 that branches from the auxiliary capacitance bus line 1210. The auxiliary capacitance electrode 1213 includes a first electrode section 1211 that branches from the auxiliary capacitance bus line 1210 and that has an auxiliary capacitance electrode under source bus line configuration, and a second electrode section 1212 that branches from the first electrode section 1211 and that has a π-type auxiliary capacitance electrode configuration.

Looking at one pixel in the conventional active matrix substrate 1201, the aperture ratios in an upper region AR18 and a lower region AR 19 within a display region (a region within the pixel in which a black matrix 1214 and the auxiliary capacitance electrode 1213 are not disposed) are different. In other words, the display brightness in regions AR18, AR19 will be different. The regions AR18, AR19 are disposed in a similar manner as regions in other pixels arranged in the direction that the gate bus line 1002 extends. As a result, when looking at all of the pixels arranged in the direction to which the gate bus line 1002 extends, the aperture ratios of an upper region ARu' and a lower region AR1' will be different, and a border between the regions AR18, AR19 will be continuously aligned in the direction to which gate bus line 1002 extends. As a result, during halftone display, line-shaped display unevenness in which the brightness is different from other sections will occur.

Such display unevenness has been particularly noticed in the border between the regions AR18, AR19. There have been instances in which this line-shaped unevenness became more apparent as the pixel pitch became smaller. As shown in FIG. 18, the conventional active matrix substrate 1201 has a configuration such that the second electrode sections that oppose a relatively wide light-shielding element are continuously arranged in the direction to which the gate bus line 1002 extends. As a result, there have been instances in which the conventional active matrix substrate 1201 could not be applied to a high-definition liquid crystal display device in which the pitch of the pixels is even smaller. This is due to the fact that, in the conventional active matrix substrate 1201, an adequate distance could not be maintained between second electrode sections in the direction to which the gate bus line 1002 extends, and there was a decrease with respect to the resolution limit in the margins between the black matrix that is included in the opposing substrate, for example. There were also instances in which the difference in brightness due to the viewing angle became larger when the liquid crystal display mode was MVA (multi-domain vertical alignment) mode, CPA (continuous pinwheel alignment) mode, FFS (fringe field switching) mode, and the like. This is due to the fact that while there are usually four domain regions in MVA mode for controlling alignment to improve the viewing angle, if there are differences in the aperture ratio among these four regions, the brightness between the regions will vary, and as a result, the viewing angle in a specific direction will become smaller, for example. When the viewing angle in a liquid crystal display device varies either in the left-right or the up-down direction, the hue changes when viewing the device at an angle, and as a result, the performance of the liquid crystal display device decreases.

Therefore, in a conventional active matrix substrate 1201 such as that shown in FIG. 18, there was room for improvement in adequately preventing a decrease in display quality in the border between regions in pixels in which the aperture ratios are different.

Patent Document 1 provides an array substrate (corresponding to the above-mentioned active matrix substrate 1101) with a large aperture ratio. The array substrate is similar to that shown in FIG. 17. However, as mentioned above, there was room for improvement regarding the substrate mentioned in Patent Document 1 in terms of resolving the above-mentioned problem of increasing the aperture ratio while adequately suppressing an increase in the capacitance of the source bus lines.

Patent Document 2 provides a display device (corresponding to the above-mentioned conventional active matrix substrate 1201) that increases the aperture ratio and the driving power. However, as mentioned above, there was room for improvement regarding the device mentioned in Patent Document 2 in terms of resolving the above-mentioned problem of adequately preventing a decrease in display quality in the borders between regions of the pixels in which the aperture ratios were different.

The inventions disclosed in Patent Documents 3 to 5 have configurations similar to those shown in FIGS. 16, 17, and 18, and there is room for improvement in these inventions as well in terms of resolving the above-mentioned problems.

The present invention takes into consideration the above-mentioned situation. Therefore, an aim of the present invention is to provide: an active matrix substrate that can increase the aperture ratio and adequately prevent decreases in display quality while adequately suppressing increases in the capacitance of the source bus lines; and a display device that includes the active matrix substrate.

Means for Solving the Problems

Upon investigating active matrix substrates that can increase the aperture ratio and prevent decreases in display quality while adequately suppressing increases in the capacitance in the source bus lines, as well as display devices that include such active matrix substrates, the inventors of the present invention focused on forming an auxiliary capacitance electrode that had both a π-type auxiliary capacitance electrode configuration and an auxiliary capacitance electrode under source bus line configuration, and then optimizing the arrangement of these two configurations. It was discovered that, if these two configurations were disposed such that the ratio of these two configurations was optimized in accordance with the pixel size and the shape of the pixel electrodes and the regions within the pixels in which the aperture ratios were different were not respectively continuously aligned in the direction to which the gate bus line extends, the aperture ratio could be increased and a decrease in display quality could be adequately prevented while adequately suppressing increases in capacitance in the source bus lines. In this way, the inventors of the present invention were able to completely resolve the above-mentioned problems and arrive at the present invention.

In other words, according to one aspect, the present invention may be an active matrix substrate including: a substrate; a plurality of gate bus lines that extend in a first direction on the substrate; a plurality of source bus lines that extend in a second direction that intersects the first direction on the substrate; a plurality of thin film transistors on the substrate that are respectively electrically connected to the plurality of gate bus lines and the plurality of source bus lines; a plurality of pixel electrodes on the substrate that are respectively electrically connected to drain electrodes of the plurality of thin film transistors and that are arranged in a matrix in the first and second directions; and a plurality of auxiliary capacitance bus lines that extend in the first direction, wherein at least one of the plurality of auxiliary capacitance bus lines has at least two auxiliary capacitance electrodes, wherein each of said at least two auxiliary capacitance electrodes includes a first electrode section and a second electrode section, wherein, in each of said at least two auxiliary capacitance electrodes, at least a portion of the first electrode section overlaps one of the plurality of source bus lines, wherein, in each of said at least two auxiliary capacitance electrodes, the second electrode section has two linear sections extending in the second direction, and at least a portion of a region between the two linear sections overlaps said one of the plurality of source bus lines, and wherein, in said at least one of the plurality of auxiliary capacitance bus lines, with respect to adjacent two of said at least two auxiliary capacitance electrodes, positions of the first electrode section and second electrode section in the second direction are alternated so as to be generally point-symmetric about a reference point on a straight line that passes through a central region of pixels arranged in the first direction along said at least one of the plurality of auxiliary capacitance bus lines.

Another configuration normally used as an active matrix substrate can be used, as appropriate, as the active matrix substrate in an embodiment of the present invention, and there are no particular restrictions regarding any of the other constituent components.

In addition, according to one aspect, the present invention may be a display device that includes the above-mentioned active matrix substrate.

Another configuration normally used as a display device can be used, as appropriate, as the display device in an embodiment of the present invention, and there are no particular restrictions regarding any of the other constituent components.

Effects of the Invention

According to one aspect of the present invention, the following can be provided: an active matrix substrate in which an aperture ratio can be increased and a decrease in display quality can be adequately prevented while an increase in a capacitance of source bus lines is adequately suppressed; and a display device that includes the active matrix substrate.

DETAILED DESCRIPTION OF EMBODIMENTS

Figure 1:
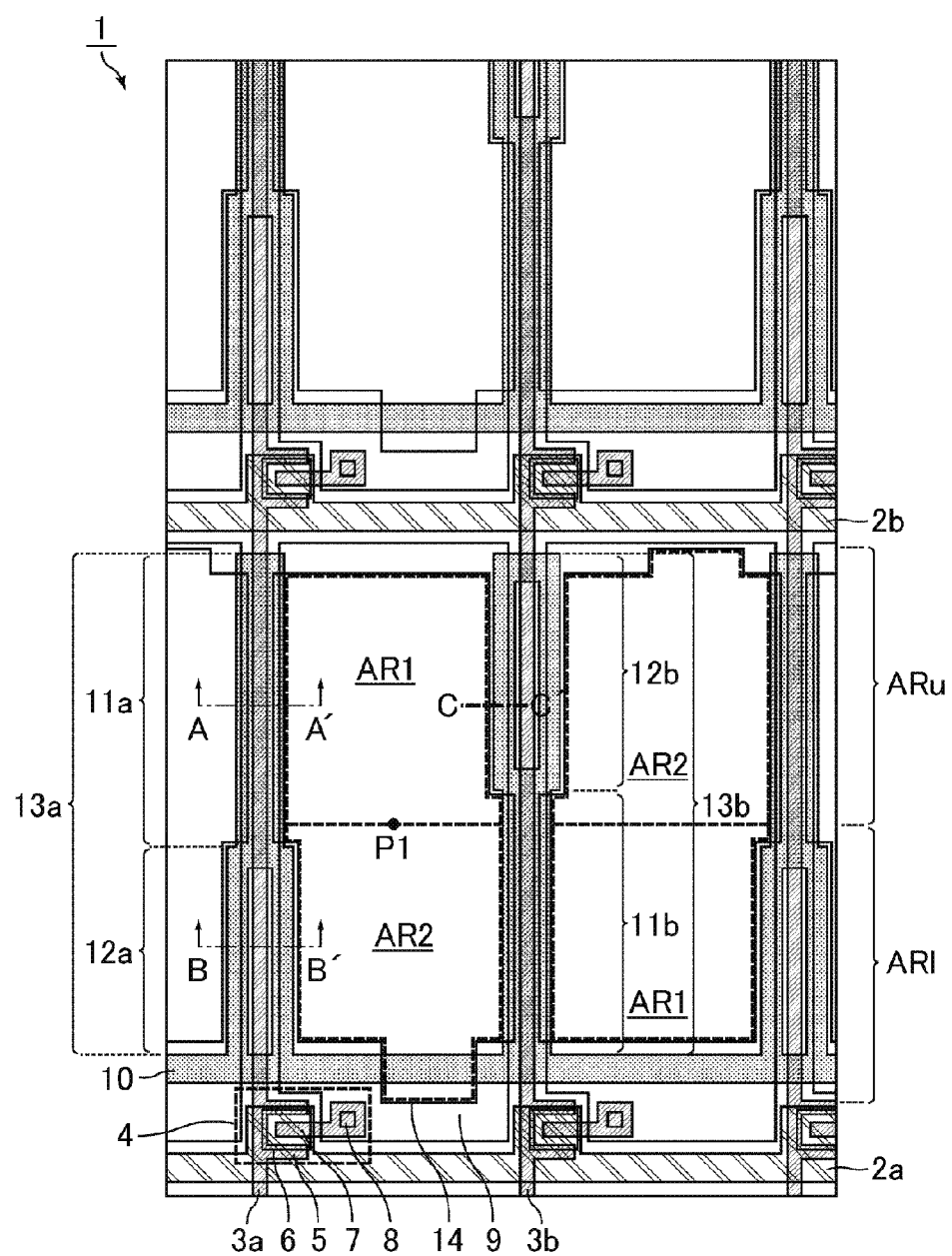
FIG. 1 is schematic plan view that shows a pixel in an active matrix substrate according to Embodiment 1.

In this specification, it is preferable that the concept of extending to a direction (such as the above-mentioned first and second directions) means to extend substantially parallel to the direction, for example. It is also preferable that the concept of intersecting a direction means to be substantially orthogonal to the direction, for example. Additionally, a substantially central portion of the respective pixels may be an actual central portion of the respective pixels, or may be an actual central portion of the display region (a region in which a black matrix of an opposing substrate that opposes the active matrix substrate and an auxiliary capacitance electrode are not disposed, for example) of the various pixels, for example. Furthermore, each of the above-mentioned plurality of auxiliary capacitance electrodes may be configured such that auxiliary capacitance is formed between the above-mentioned plurality of pixel electrodes. The capacitance of the source bus lines is the capacitance between the source bus lines and the wiring and the like (gate bus lines, auxiliary capacitance bus lines, and auxiliary capacitance electrodes, for example) that overlap the source bus lines by means of an insulating film, for example. The concept of being symmetrically disposed may mean that the locations of electrode sections (the above-mentioned first and second electrode sections, for example) are symmetrically disposed (such as first electrode sections 11a, 11b, and second electrode sections 12a, 12b shown in FIG. 1, for example), or may mean that the locations of the electrode sections are symmetrically disposed graphically when the shape of the electrode sections is taken into consideration (such as first electrode sections 111a, 111b and second electrode sections 112a, 112b shown in FIG. 4, for example), for example.

Preferred embodiments of an active matrix substrate according to the present invention will be explained next.

According to one aspect of an active matrix substrate according to the present invention, the above-mentioned plurality of auxiliary capacitance electrodes may be disposed in the same layer as the above-mentioned plurality of gate bus lines.

Thus, the plurality of auxiliary capacitance electrodes and the plurality of gate bus lines can be formed in the same step, which allows for the manufacturing process to become shorter. It is also preferable that the plurality of auxiliary capacitance electrodes and the plurality of gate bus lines be formed of the same conductive material. Additionally, the above-mentioned phrase of "the above-mentioned plurality of auxiliary capacitance electrodes are disposed in the same layer as the above-mentioned plurality of gate bus lines" may mean that the plurality of auxiliary capacitance electrodes and the plurality of gate bus lines come into contact with the same member (a glass substrate, for example) on the glass substrate side and/or the side opposite of the glass substrate side, for example. The plurality of auxiliary capacitance electrodes and the plurality of gate bus lines may also be formed on the same glass substrate, and may be disposed in locations separate from one another, for example.

According to one aspect of the active matrix substrate of the present invention, the active matrix substrate may further include an insulating film in a layer between the plurality of source bus lines and the plurality of pixel electrodes, and the insulating film may be an inorganic insulating film.

According to one aspect of the active matrix substrate of the present invention, the active matrix substrate may further include an insulating film in a layer between the plurality of source bus lines and the plurality of pixel electrodes, and the insulating film may be an organic insulating film.

According to one aspect of the active matrix substrate of the present invention, the active matrix substrate may further include an insulating film in a layer between the plurality of source bus lines and the plurality of pixel electrodes, and the insulating film may be an film in which an inorganic insulating film and an organic insulating film have been stacked.

Thus, a configuration (hereafter referred to as a "Pixel on Pas configuration") in which the pixel electrodes of the respective pixels are disposed upon the insulating film can exhibit the effects of an aspect of the present invention. A "Pixel on Pas" configuration is a configuration in which an insulating film 17 is disposed in a layer between a source bus line 3a and pixel electrodes 9 in an active matrix substrate 1 like the one shown in FIG. 2, for example. As mentioned above, the auxiliary capacitance electrodes partially block electric fields generated between the pixel electrodes and the source bus lines. In order for this effect to be exhibited, it is even more preferable that the insulating film be an inorganic insulating film. This is due to the fact that, compared to inorganic insulating films, organic insulating films have a lower relative permittivity and are more easily made thicker. As a result, in instances in which an organic insulating film is used, the capacitance between the source bus lines and the pixel electrodes is smaller and the electric fields that the auxiliary capacitance electrodes attempt to block are smaller compared to instances in which an inorganic insulating film is used. There is no particular limit to the thickness of the inorganic insulating film, but it is preferable that the thickness be 0.2 to 0.6 μm. There is no particular limit to the thickness of the organic insulating film, but it is preferable that the thickness be 1 to 4 μm.

According to one aspect of the active matrix substrate of the present invention, one of the plurality of gate bus lines may be disposed in each row of the plurality of pixel electrodes arranged in the first direction, and one of the plurality of source bus lines may be disposed in each column of the plurality of pixel electrodes arranged in the second direction.

Thus, the effect of one aspect of the present invention can be exhibited in a single scan configuration. In this specification, pixel rows can be understood to be, from among a plurality of one-dimensional pixel electrode arrangements disposed in a matrix, the pixel electrodes in one direction, and a pixel column can be understood as being another of the one-dimensional arrangements that is arranged in a direction that intersects the pixel rows (preferably being substantially orthogonal to the pixel rows). A single scan configuration is a configuration in which, in an active matrix substrate 1 like the one shown in FIG. 1, one gate bus line (a gate bus line 2a or a gate bus line 2b, for example) is disposed in each pixel row that is arranged in a horizontal direction (a direction to which the gate bus line 2a extends), and one source bus line (a source bus line 3a or a source bus line 3b, for example) is arranged in each pixel column that is arranged in a vertical direction (a direction to which the source bus line 3a extends), for example. According to a single scan configuration, there will be one gate bus line for each pixel row.

According to one aspect of the active matrix substrate of the present invention, the above-mentioned reference point may be disposed in the center of the respective pixels.

In an active matrix substrate 1 that has a single scan configuration, such as the one shown in FIG. 1, when the point P1 that is in the center of the display region of a pixel is used as the reference point, the adjacent first electrode sections 11a, 11b are disposed symmetrically with respect to each other about the point P1, for example. In addition, the adjacent second electrode sections 12a, 12b are disposed symmetrically with respect to each other about the point P1. The first electrode sections 11a, 11b and the second electrode sections 12a, 12b are disposed identically to those in the other pixels arranged in the horizontal direction. Consequently, the placement of two regions AR1, AR2 within the display region of the pixel switches between adjacent pixels arranged in the horizontal direction. As a result, the aperture ratios of an upper region ARu and a lower region AR1 in one pixel row are substantially identical, and line-shaped unevenness such as that mentioned above can be prevented from occurring. Therefore, a decrease in display quality can be adequately prevented. It is preferable that "the aperture ratios are substantially identical" mean that the difference between the aperture ratios of the various regions be 10% or less, with 1% or less being more preferable, for example. Since the difference between aperture ratios of the various regions will vary according to factors such as pixel pitch, liquid crystal display mode, and the like, for example, it is preferable that such factors also be taken into consideration.

According to one aspect of an active matrix substrate of the present invention, two of the plurality of gate bus lines may be disposed in each of the plurality of pixel electrode rows arranged in the first direction, and one of the plurality of source bus lines may be disposed in every other of the plurality of pixel electrode columns arranged in the second direction.

Thus, the effect of one aspect of the present invention can be exhibited in a dual gate configuration. A dual gate configuration is a configuration in which, in an active matrix substrate 101 such as the one shown in FIG. 4, two gate bus lines (gate bus lines 102a, 102b, or gate bus lines 102c, 102d, for example) are disposed in each pixel row arranged in the horizontal direction (the direction to which the gate bus line 102a extends), and one source bus line (source bus lines 103a, 103b, 103c, for example) is disposed in every other pixel column arranged in the vertical direction (the direction to which the source bus line 103a extends), for example. According to a dual gate configuration, there will be two gate bus lines for each pixel row. In addition, according to a dual gate configuration, the number of gate bus lines will double and the number of source bus lines will be cut in half. As a result, the number of gate drivers will double and the number of source drivers will be cut in half. Normally, source drivers are more expensive than gate drivers, which means that the total cost of drivers can be reduced in such a case. Therefore, by applying the present invention to an active matrix substrate that has a dual gate configuration, the effects of one aspect of the present invention will be exhibited, and the total cost of drivers can be decreased.

According to one aspect of the active matrix substrate of the present invention, the above-mentioned reference point may be disposed between adjacent pixels.

Figure 4:
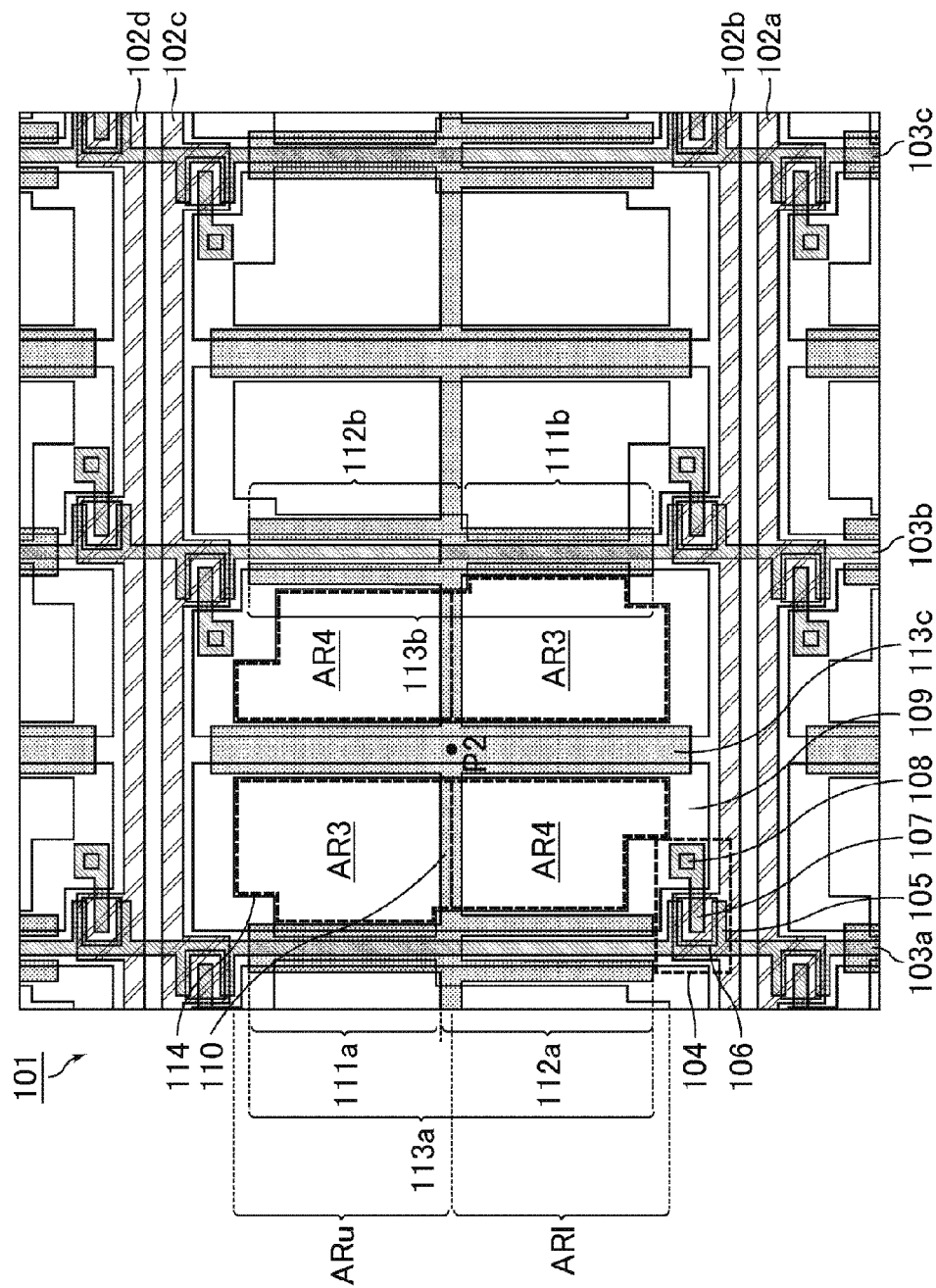
FIG. 4 is schematic plan view that shows a pixel in an active matrix substrate according to Embodiment 2-1.

In an active matrix substrate 101 that has a dual gate configuration such as the one shown in FIG. 4, when a point P2, which is located between adjacent pixels on a straight line that passes through the center of the display region of the various pixels arranged in the horizontal direction, is used as the reference point, adjacent first electrode sections 111a, 111b are disposed symmetrically with respect to each other about the point P2, for example. In addition, adjacent second electrode sections 112a, 112b are also disposed symmetrically with respect to each other about the point P2. The first electrode sections 111a, 111b and the second electrode sections 112a, 112b are disposed identically to those in the other pixels arranged in the horizontal direction. Consequently, the placement of two regions AR3, AR4 within the display region of the pixel switches between adjacent pixels arranged in the horizontal direction. As a result, the aperture ratios of the upper region ARu and the lower region ARl in one pixel row are substantially identical, and line-shaped unevenness like that mentioned above can be prevented from occurring. Therefore, a decrease in display quality can be adequately prevented.

According to one aspect of the active matrix substrate of the present invention, the plurality of thin film transistor elements, which are adjacent to each other and arranged in the first direction, may be respectively disposed on different sides of the plurality of gate bus lines.

Thus, the effect of an aspect of the present invention can be exhibited in a structure (hereafter referred to as an upper and lower individually driven structure) in which the upper and lower halves of pixels arranged in the first direction are each driven individually. An upper and lower individually driven structure is a structure in which, in an active matrix substrate such as the one shown in FIG. 11, thin film transistor elements, which are electrically connected to the gate bus line 2a and which are arranged in the direction in which the gate bus line 2a extends, are alternately disposed on both sides (in FIG. 11, the upper and lower sides) of the gate bus line 2a, thus resulting in a structure in which pixels corresponding to thin film transistor elements (thin film transistor elements 4a, 4a', 4a", for example) arranged on one side (lower side) of the gate bus line 2a and pixels corresponding to thin film transistor elements (thin film transistor elements 4b, 4b', 4b", for example) arranged on the other side (the upper side) of the gate bus line 2a are driven, for example. Thus, all of the pixels disposed on both sides of the gate bus line 2a are driven in a manner in which the upper and lower halves of each pixel are driven individually. The upper and lower individually driven structure will be explained in more detail below. A concept in which the plurality of thin film transistor elements, which are adjacent to each other and arranged in the first direction, are respectively disposed on different sides of the plurality of gate bus lines was mentioned above. This concept means that, in an active matrix substrate such as the one shown in FIG. 11, the thin film transistor elements 4a, 4b, which are adjacent to each other and arranged in the horizontal direction, are disposed on both sides (the upper and lower sides) of the gate bus line 2a, for example.

According to one aspect of an active matrix substrate of the present invention, the above-mentioned plurality of auxiliary capacitance bus lines may be disposed so as to pass through the center of the pixels.

According to one aspect of an active matrix substrate of the present invention, the above-mentioned plurality of auxiliary capacitance bus lines may be disposed on the periphery of the pixels.

An active matrix substrate 101 such as the one shown in FIG. 4, for example, is an example of a substrate in which "the above-mentioned plurality of auxiliary capacitance bus lines may be disposed so as to pass through the center of the pixels." When auxiliary capacitance bus lines 110 are disposed so as to pass through the center of the pixels, the distance between the gate bus line 102b (102c) and the auxiliary capacitance bus line 110 increases. This leads to fewer leak defects, and as a result, the manufacturing yield increases. In order to decrease the number of leak defects, it is preferable that the distance between the gate bus line and the auxiliary capacitance line be 7 μm or above, and even more preferable that the distance be 10 μm or above.

Figure 8:
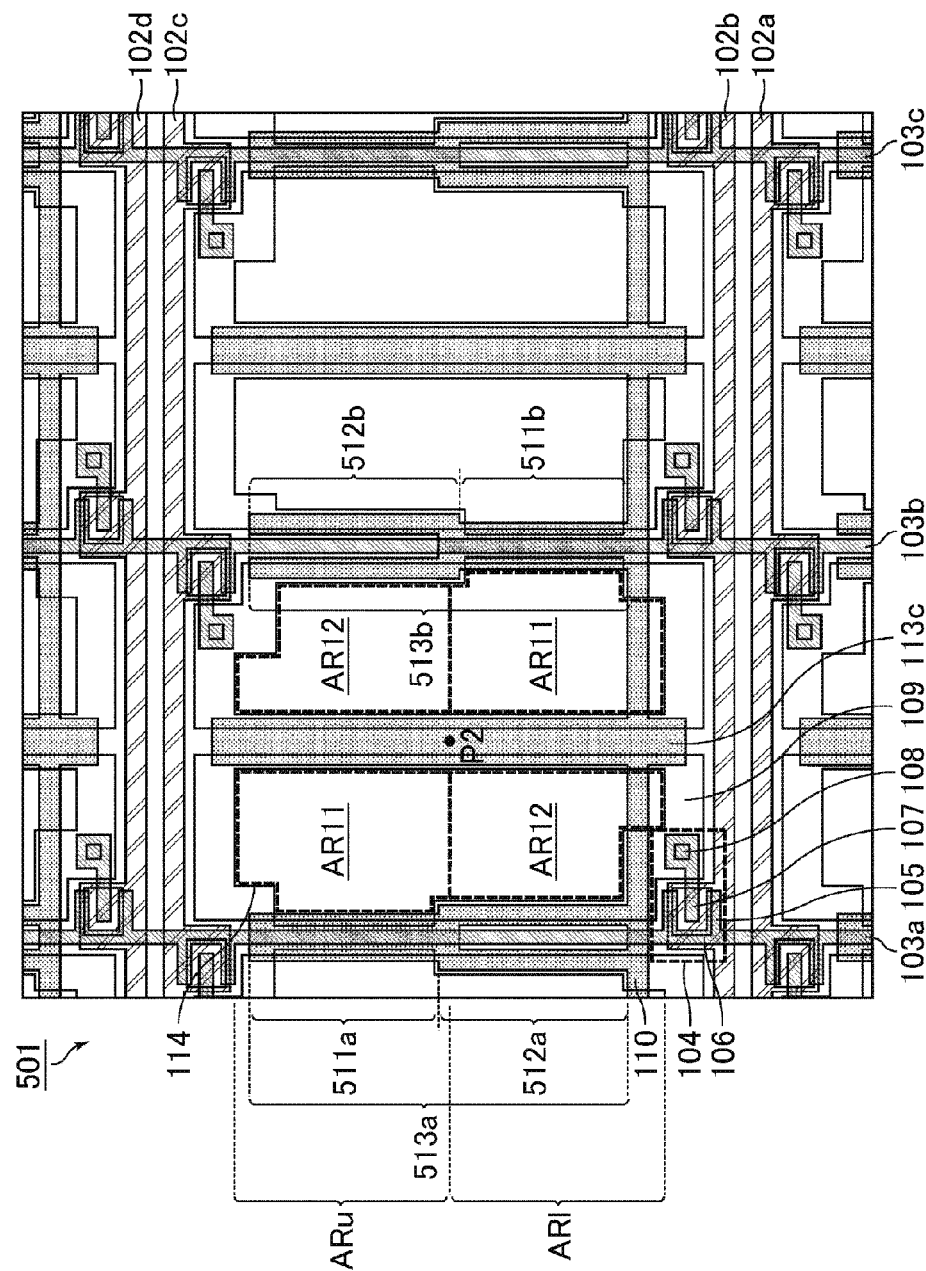
FIG. 8 is schematic plan view that shows a pixel in an active matrix substrate according to Embodiment 3-1.

An active matrix substrate 501 such as that shown in FIG. 8, for example, is an example of a substrate in which "the above-mentioned plurality of auxiliary capacitance bus lines are disposed on the periphery of the pixels," and the auxiliary capacitance bus line 110 may be disposed near the gate bus line 102b. When the auxiliary capacitance bus line 110 is disposed on the periphery of the pixel, even if a decrease in display quality, such as that due to light leakage as a result of orientation disorder, occurs near the gate bus line 102b, it is easy to block the locations where light leakage is occurring due to the auxiliary capacitance bus line 110 being disposed near the gate bus lines 102. For such blocking of light leakage to occur, it is preferable that the distance between the gate bus line and the auxiliary capacitance bus line be 7 μm or less, and even more preferable that the distance be 5 μm or less.

The plurality of auxiliary capacitance bus lines may have an arrangement different from that mentioned above (passing through the center of the pixels or to the periphery of the pixels) as long the effect according to one aspect of the present invention is exhibited.

According to one aspect of the active matrix substrate of the present invention, the second electrode section may have a loop-like structure in which the ends of the two linear sections mentioned above are connected to each other.

An electrode section, such as the second electrode section 12b shown in FIG. 1, for example, in which the ends of two linear sections are connected to each other to form a loop, may be used as an electrode section "having a loop-like structure." When the electrode section has a loop-like structure like that of the second electrode section 12b, even if a portion (the portion corresponding to the line C-C' in FIG. 1, for example) becomes disconnected, there will not be any portions that become so-called "floating islands" (electrically insulated from everything else). Therefore, the effect of the auxiliary capacitance electrodes partially blocking electric fields generated between the pixel electrodes and the source bus lines can be maintained.

According to one aspect of the active matrix substrate of the present invention, the plurality of thin film transistor elements may have a semiconductor layer that includes an oxide semiconductor.

An oxide semiconductor has higher mobility and less characteristic variation than amorphous silicon. As a result, thin film transistor elements that include an oxide semiconductor have a high driving frequency and can be driven at a faster speed than thin film transistor elements that include amorphous silicon, and a smaller number of transistor elements need to be used for one pixel. Therefore, such transistor elements are suitable for next generation display devices which have higher resolution. Furthermore, an oxide semiconductor film is formed by a process that is simpler than that for a polycrystalline silicon film, and thus, the oxide semiconductor film can be applied to devices requiring a large area. Therefore, when thin film transistor elements included in one aspect of an active matrix substrate of the present invention have a semiconductor layer that includes an oxide semiconductor, the effect of one aspect of the present invention can be exhibited, and an even higher driving speed can be achieved.

A compound (In—Ga—Zn—O) formed of indium (In), gallium (Ga), zinc (Zn), and oxygen (O), a compound (In—Sn—Zn—O) formed of indium (In), tin (Sn), zinc (Zn), and oxygen (O), a compound (In—Al—Zn—O)

formed of indium (In), aluminum (Al), zinc (Zn), and oxygen (O), or the like, for example, may be used to form the oxide semiconductor.

The respective configurations mentioned above may be appropriately combined within a scope that does not depart from the gist of the present invention.

A display device of the present invention that has the preferred configurations may be a display device that includes an active matrix substrate that has the above-mentioned preferred configurations.

The respective configurations mentioned above may be appropriately combined within a scope that does not depart from the gist of the present invention.

Embodiments are shown below and the present invention is described in further detail with reference to the drawings, but the present invention is not limited to these embodiments. Furthermore, the respective configurations of the embodiments described below may be appropriately combined or changed within a scope that does not depart from the gist of the present invention.

The present invention can be applied generally to active matrix substrates that include auxiliary capacitance electrodes and display devices that include such active matrix substrates. Such active matrix substrates and liquid crystal display devices that include such active matrix substrates will be described in the embodiments below.

Embodiment 1

Embodiment 1 has a single scan configuration in which auxiliary capacitance bus lines are disposed on the periphery of pixels and second electrode sections of a portion of auxiliary capacitance electrodes have a loop-like structure. The ratio (the ratio of the length in the direction to which source bus lines extend) of first electrode sections to second electrode sections in the auxiliary capacitance electrodes is 1:1. Overlapping descriptions of a single scan configuration, a configuration in which auxiliary capacitance bus lines are disposed on the periphery of pixels, and a loop-like structure will not repeated here since such configurations and structures were described above.

FIG. 1 is schematic plan view that illustrates the pixels of an active matrix substrate according to Embodiment 1. While FIG. 1 mainly illustrates the configuration of an active matrix substrate, a portion of the configuration of an opposing substrate (a black matrix 14, for example) that opposes the active matrix substrate is also shown. As shown in FIG. 1, an active matrix substrate 1 includes a gate bus line 2a, a source bus line 3a that extends in a direction that intersects the gate bus line 2a, a thin film transistor element 4 that is electrically connected to the gate bus line 2a and the source bus line 3a, and a pixel electrode 9 that is electrically connected to a drain electrode 7 of the thin film transistor element 4 via a contact hole 8. In a pixel such as that shown in FIG. 1, a voltage provided by the source bus line 3a is applied to the pixel electrode 9 via a source electrode 5, a semiconductor layer 6, the drain electrode 7, and the contact hole 8 when the pixel is selected by the gate bus line 2a. There are no particular restrictions regarding the structure of the semiconductor layer 6, but it is preferable that the semiconductor layer 6 include an oxide semiconductor.

The active matrix substrate 1 includes an auxiliary capacitance bus line 10 that extends in the same direction as the gate bus line 2a, and an auxiliary capacitance electrode 13a (13b) that branches from the auxiliary capacitance bus line 10 and that extends in the same direction as the source bus line 3a (3b). The auxiliary capacitance electrode 13a (13b) is formed of a first electrode section 11a (11b) that has an auxiliary capacitance electrode under source bus line configuration, and a second electrode section 12a (12b) that has a π-type auxiliary capacitance electrode configuration. Therefore, according to an aspect of Embodiment 1, the aperture ratio can be increased while still adequately suppressing the capacitance of the source bus line. The first and second electrode sections prevent shadowing, which was mentioned above. The first electrode section 11a and the second electrode section 12a also partially block an electric field generated between the pixel electrode 9 and the source bus line 3a and decrease the capacitance between the source bus line 3a and the pixel electrode 9, for example.

In the active matrix substrate 1, when a point P1 that is in the center of a display region of a pixel is set as a reference point, adjacent first electrode sections 11a, 11b are disposed symmetrically with respect to the point P1. Adjacent second electrode sections 12a, 12b are also disposed symmetrically with respect to point P1. The first electrode sections 11a, 11b and the second electrode sections 12a, 12b are disposed the same as those in the other pixels arranged in the horizontal direction. Consequently, the placement of two regions AR1, AR2 within the display region of the pixel switches between adjacent pixels arranged in the horizontal direction. As a result, the aperture ratios of an upper region ARu and a lower region AR1 in one pixel row are substantially identical, and line-shaped unevenness like that mentioned above can be prevented from occurring. Therefore, according to an aspect of Embodiment 1, decreases in display quality can be adequately prevented.

The second electrode section 12a does not have a loop-like structure itself. However, since the second electrode section 12a is electrically connected to the auxiliary capacitance bus line 10, a loop-like structure is formed by combining the second electrode section 12a with the auxiliary capacitance bus line 10. Thus, even if a portion of the second electrode section 12a becomes disconnected, the effect of partially blocking an electric field generated between the pixel electrode and the source bus line can be maintained.

The horizontal direction (the direction to which the gate bus line 2a extends) and the vertical direction (the direction to which the source bus line 3a extends) in FIG. 1 respectively correspond to the first and second directions mentioned above in one aspect of the present invention. This also applies to the embodiments that will be described hereafter.

Figure 2:
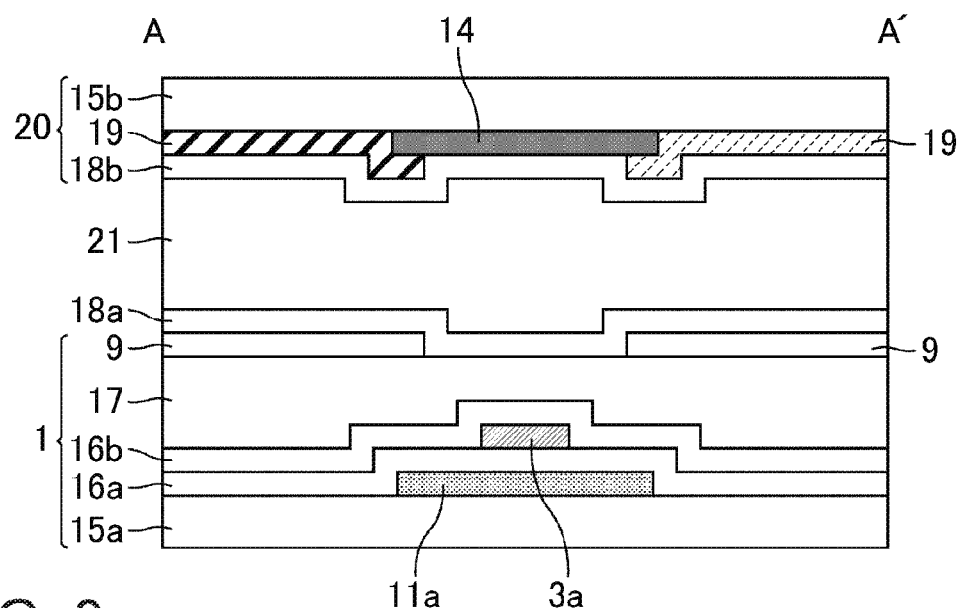
FIG. 2 is a schematic cross-section that illustrates a cross-section of the portion that corresponds to the line A-A' in FIG. 1.
Figure 3:
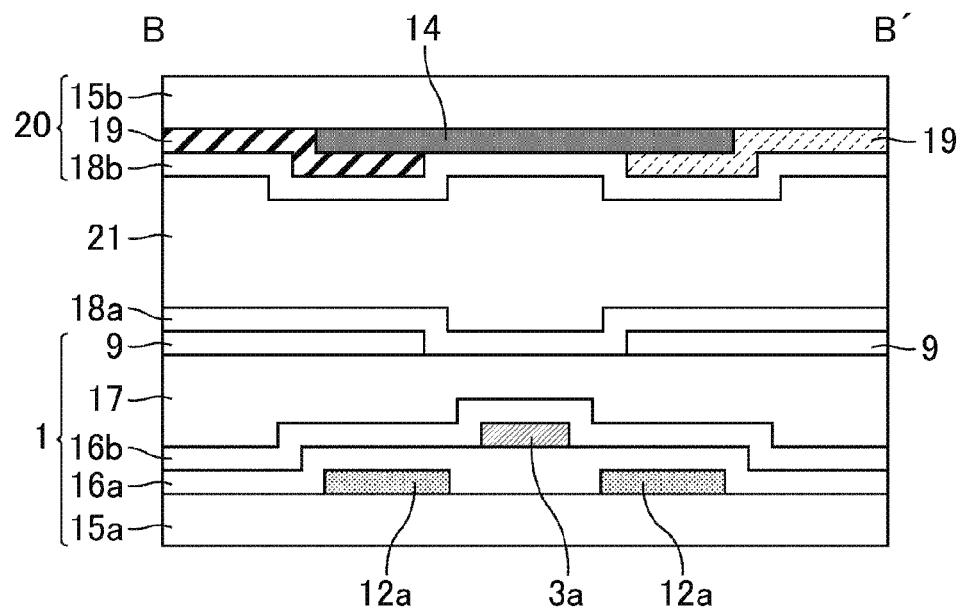
FIG. 3 is a schematic cross-section that illustrates a cross-section of the portion that corresponds to the line B-B' in FIG. 1.

Next, the structure of a liquid crystal display device that corresponds to the section in which the first and second electrode sections are disposed will be explained using FIGS. 2 and 3. As shown in FIGS. 2 and 3, the basic structure of a liquid crystal display device includes the active matrix substrate 1, an opposing substrate 20 that opposes the active matrix substrate 1, and a liquid crystal layer 21 sandwiched between the two substrates.

The structure of a liquid crystal display device that corresponds to the section in which the first electrode section is disposed will be explained first. FIG. 2 is a schematic cross-section that illustrates a cross-section of the section that corresponds to the line A-A' in FIG. 1. As shown in FIG. 2, the active matrix substrate 1 has: a glass substrate 15a; the first electrode section 11a provided on a main surface of the glass substrate 15a; a protective film 16a provided so as to cover the first electrode section 11a; the source bus line 3a, which is provided above a portion of the protective film 16a and provided in a location so as to overlap at least a portion of the first electrode section 11a in a plan view of the main surface of the glass substrate 15a; a protective film 16b provided so as to cover the source bus line 3a; an insulating film 17 that is provided on the protective film 16b and that is provided on the side opposite of the glass substrate 15a side of the protective film 16b; and a pixel electrode 9 provided on a portion of the insulating film 17, and provided in a location so as to overlap at least a portion of the first electrode section 11a in a plan view of the main surface of the glass substrate 15a. In addition, an alignment film 18a is provided on the liquid crystal layer 21 side of the active matrix substrate 1.

The first electrode section 11a is disposed in the same layer as the gate bus line 2a (which is shown in FIG. 1 but not FIG. 2). The insulating film 17 may be an inorganic insulating film, an organic insulating film, or a film in which an inorganic insulating film and an organic insulating film have been stacked. It is preferable that the insulating film 17 be an inorganic insulating film so that the effect of preventing shadowing may be exhibited. A silicon nitride (SiNx) or the like, for example, can be used as the inorganic insulating film, and a photosensitive organic film or the like, for example, can be used as the organic insulating film.

As shown in FIG. 2, the opposing substrate 20 has: a glass substrate 15b; a black matrix 14 that is provided on the main surface of the glass substrate 15b and that overlaps the first electrode section 11a; and a color filter 19 that covers a portion of the black matrix 14. In addition, an alignment film 18b is provided on the liquid crystal layer 21 side of the opposing substrate 20.

The structure of a liquid crystal display device that corresponds to the section in which the second electrode section is disposed will be explained next. FIG. 3 is a schematic cross-section that illustrates a cross-section of the section that corresponds to the line B-B' in FIG. 1. As shown in FIG. 3, the active matrix substrate 1 has: the glass substrate 15a; the second electrode section 12a (corresponding to the cross-section of two linear sections) provided on the main surface of the glass substrate 15a; the protective film 16a provided so as to cover the second electrode section 12a; the source bus line 3a, which is provided on a portion of the protective film 16a and provided in a location so as to overlap at least a portion of the region between the two sections of the second electrode section 12a in a plan view of the main surface of the glass substrate 15a; the protective film 16b provided so as to cover the source bus line 3a; the insulating film 17 that is provided on the protective film 16b and that is provided on the side opposite of the glass substrate 15a side of the protective film 16b; and the pixel electrode 9 that is provided on a portion of the insulating film 17, and provided in a location so as to overlap at least a portion of the second electrode section 12a in a plan view of the main surface of the glass substrate 15a. In addition, an alignment film 18a is provided on the liquid crystal layer 21 side of the active matrix substrate 1.

The second electrode section 12a is disposed in the same layer as the gate bus line 2a (which is shown in FIG. 1 but not FIG. 3).

As shown in FIG. 3, the opposing substrate 20 has: the glass substrate 15b; the black matrix 14 that is provided on the main surface of the glass substrate 15b and that overlaps the second electrode sections 12a and the space therebetween; and a color filter 19 that covers a portion of the black matrix 14. In addition, the alignment film 18b is provided on the liquid crystal layer 21 side of the opposing substrate 20.

Looking at the width of the black matrix 14, the section of the black matrix 14 that opposes the second electrode section 12a is wider than the section that opposes the first electrode section 11a. As shown in FIG. 1, Embodiment 1 has a configuration in which the second electrode sections, which oppose the black matrix where the black matrix is relatively wider, are not continuously aligned in the horizontal direction. Therefore, an adequate distance between second electrode sections can be maintained in the horizontal direction, the margins between the black matrix can be improved with respect to the resolution limit, and it becomes easier to form a black matrix with high precision. As a result, Embodiment 1 can be suitably applied to a high resolution liquid crystal display device in which the size of the pixels is small (the pixel pitch in the horizontal direction is small).

In Embodiment 1, the auxiliary capacitance bus line is disposed on the periphery of the pixel. However, the auxiliary capacitance bus line is not limited to this location, and may be disposed so as to pass through the center of the pixel, for example.

In Embodiment 1, the second electrode section has a loop-like structure. There are no particular restrictions as to whether or not the second electrode section has a loop-like structure, however. For example, all of the second electrode sections may have a loop-like structure, none of the second electrode sections may have a loop-like structure, or a portion of the second electrode sections may have a loop-like structure. If a second electrode section has a loop-like structure, as mentioned above, even if a portion of the electrode section becomes disconnected, the effect of partially blocking an electric field that is generated between the pixel electrode and the source bus line can still be maintained. If the second electrode section does not have a loop-like structure, the capacitance between the source bus line and the auxiliary capacitance electrode (the second electrode section) will decrease even further.

In Embodiment 1, the ratio (the ratio of the length in the direction to which the source bus lines extend) of the first electrode sections to the second electrode sections is 1:1. There is no particular limit to this ratio, however, and the ratio may be set to any desired value in accordance with the pixel size, shape of the pixel electrodes, any desired specifications (power consumption, display quality, and the like), and the like so that the effect of an aspect of the present invention may be exhibited.

As shown in FIG. 1, in Embodiment 1, the first and second electrode sections were disposed in the same location with respect to the pixel columns in the vertical direction. There are no particular restrictions as to how the electrode sections are disposed, however, and the location of the electrode sections may be switched with each other, for example.

There are no particular restrictions regarding the liquid crystal display mode of the liquid crystal display device according to Embodiment 1. Looking at the present invention from the perspective of blocking light leakage from a backlight, a normally white mode (a mode that displays in white when no voltage is being applied) such as TN (twisted nematic) mode has a particularly significant effect, for example. However, looking at the present invention from the perspective of improving contrast by blocking light leakage resulting from orientation disorder in the periphery of the pixels, normally black modes (modes that display in black when no voltage is being applied) such as MVA mode, CPA mode, FFS mode, IPS (in-plane switching) mode, and TBA (transverse bend alignment) mode are effective, for example. In a normal MVA mode, according to one aspect of the present invention, variations in the aperture ratio of four domain regions can be prevented, meaning that variations in brightness due to the viewing angle can be adequately prevented, for example. In addition, there are no particular restrictions regarding the method of alignment, and the present embodiment can be suitably used in PSA (polymer sustained alignment) technology, photoalignment technology, or the like. There are also no particular restrictions regarding the driving method (multi-pixel technology, for example). There are also no particular limitations regarding the shape of the pixels, and the pixels may be vertically-long pixels, horizontally-long pixels, or V-shaped pixels.

Embodiment 2

Embodiment 2 has a dual gate configuration in which auxiliary capacitance bus lines are disposed so as to pass through the center of pixels. In Embodiment 2, there are no particular restrictions as to whether or not the second electrode section has a loop-like structure. For example, all of the second electrode sections may have a loop-like structure, none of the loop second electrode sections may have a loop-like structure, or a portion of the second electrode sections may have a loop-like structure. There is also no particular limit to the ratio (the ratio of the length in the direction to which the source bus lines extend) of the first electrode section to the second electrode section, and the ratio may be set to any desired value in accordance with the pixel size, shape of the pixel electrodes, any desired specifications (power consumption, display quality, and the like) and the like so that the effect of an aspect of the present invention may be exhibited. More detailed examples will be given in Embodiments 2-1 to 2-4, which will be explained below. Descriptions of a dual gate configuration and a configuration in which the auxiliary capacitance bus lines are disposed so as to pass through the center of the pixels will not be repeated since such descriptions were given above.

Embodiment 2-1

In Embodiment 2-1, second electrode sections of auxiliary capacitance electrodes do not have a loop-like structure. In addition, the ratio (the ratio of the length in the direction to which the source bus lines extend) of a first electrode section to a second electrode section of an auxiliary capacitance electrode is 1:1.

FIG. 4 is schematic plan view that shows a pixel of an active matrix substrate according to Embodiment 2-1. While FIG. 4 mainly illustrates the configuration of an active matrix substrate, it also shows a portion of a configuration of an opposing substrate (a black matrix 114, for example) that opposes the active matrix substrate. As shown in FIG. 4, an active matrix substrate 101 includes: a gate bus line 102b; a source bus line 103a that extends in a direction that intersects the gate bus line 102b; a thin film transistor element 104 that is electrically connected to the gate bus line 102b and the source bus line 103a; and a pixel electrode 109 that is electrically connected to a drain electrode 107 of the thin film transistor element 104 via a contact hole 108. In a pixel such as that shown in FIG. 4, a voltage provided by the source bus line 103a is applied to the pixel electrode 109 via a source electrode 105, a semiconductor layer 106, the drain electrode 107, and the contact hole 108 when the pixel is selected by the gate bus line 102b. There are no particular restrictions regarding the structure of the semiconductor layer 106, but it is preferable that the semiconductor layer 106 include an oxide semiconductor.

The active matrix substrate 101 includes an auxiliary capacitance bus line 110 that extends in the same direction as the gate bus line 102b, and an auxiliary capacitance electrode 113a (113b, 113c) that branches from the auxiliary capacitance bus line 110 and that extends in the same direction as the source bus line 103a (103b). The auxiliary capacitance electrode 113a (113b) is formed of a first electrode section 111a (111b) that has an auxiliary capacitance electrode under source bus line configuration, and a second electrode section 112a (112b) that has a π-type auxiliary capacitance electrode configuration. Therefore, according to an aspect of Embodiment 2-1, the aperture ratio can be increased while still adequately suppressing the capacitance of the source bus line. The first and second electrode sections prevent shadowing, which was mentioned above. The first electrode section 111a and the second electrode section 112a also partially block an electric field generated between the pixel electrode 109 and the source bus line 103a and decrease the capacitance between the source bus line 103a and the pixel electrode 109, for example.

In the active matrix substrate 101, when a point P2, which is disposed between adjacent pixels on a line that passes through the center of a display region of respective pixels aligned in the horizontal direction, is set as a reference point, adjacent first electrode sections 111a, 111b are disposed symmetrically with respect to the point P2. Adjacent second electrode sections 112a, 112b are also disposed symmetrically with respect to point P2. The first electrode sections 111a, 111b and the second electrode sections 112a, 112b are disposed the same as those in other pixels arranged in the horizontal direction. Consequently, the placement of two regions AR3, AR4 within the display region of the pixel switches between adjacent pixels arranged in the horizontal direction. As a result, the aperture ratios of an upper region ARu and a lower region AR1 in one pixel row are substantially identical, and line-shaped unevenness like that mentioned above can be prevented from occurring. Therefore, according to an aspect of Embodiment 2-1, decreases in display quality can be adequately prevented.

The structure of a liquid crystal display device that corresponds to the section in which the first and second electrode sections are disposed is the same as that of Embodiment 1, so an explanation of identical parts will not be repeated here.

Embodiment 2-2

In Embodiment 2-2, the second electrode sections of the auxiliary capacitance electrodes do not have a loop-like structure. In addition, the ratio (the ratio of the length in the direction to which the source bus lines extend) of a first electrode section to a second electrode section of an auxiliary capacitance electrode is 1:3.

Other than the configuration of the auxiliary capacitance electrode, an active matrix substrate and a liquid crystal display device according to Embodiment 2-2 are identical to those of Embodiment 2-1. An explanation of identical parts will therefore not be repeated here.

Figure 5:
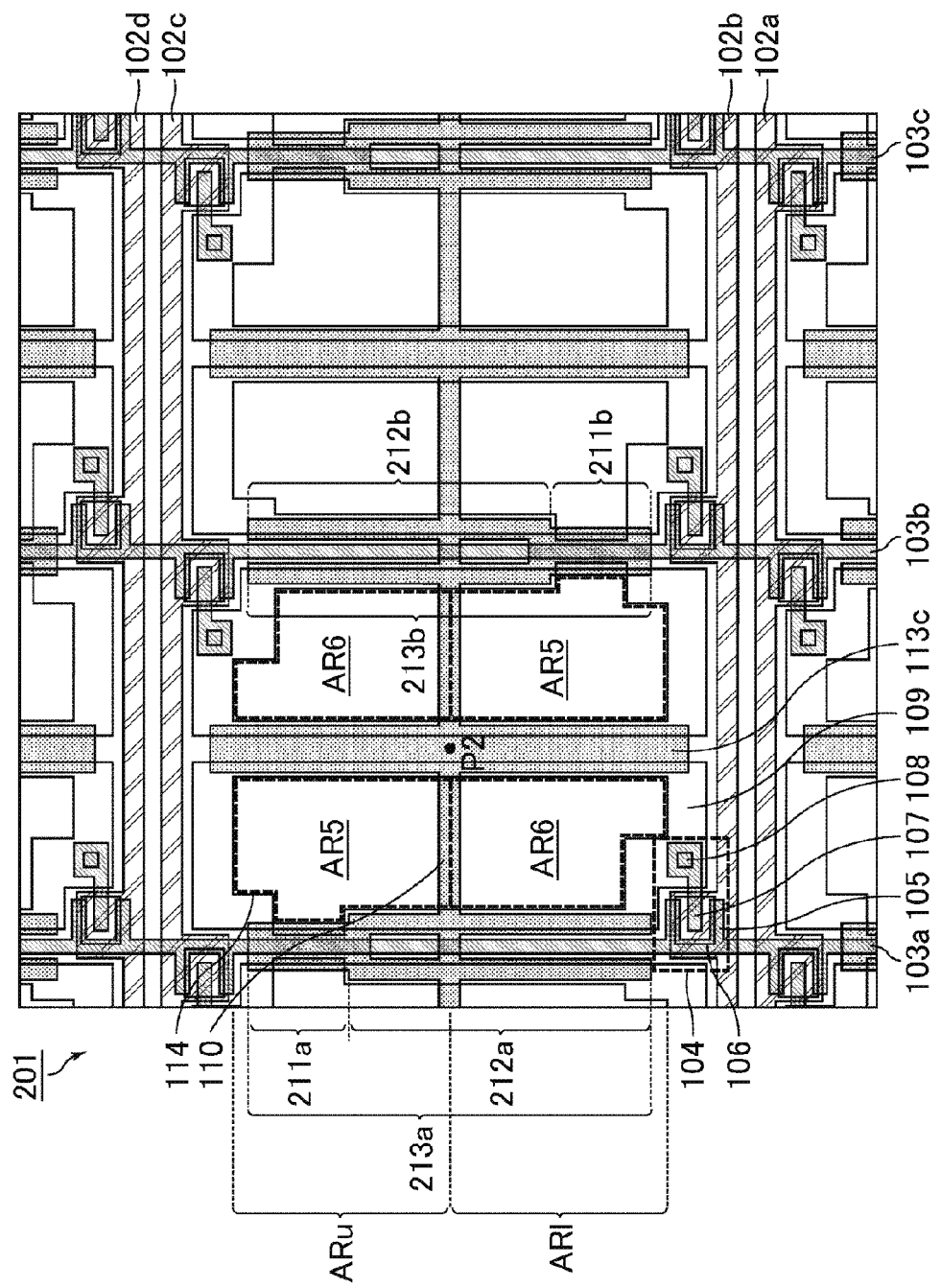
FIG. 5 is schematic plan view that shows a pixel in an active matrix substrate according to Embodiment 2-2.

FIG. 5 is schematic plan view that illustrates a pixel of an active matrix substrate according to Embodiment 2-2. An active matrix substrate 201 includes an auxiliary capacitance bus line 110 that extends in the same direction as a gate bus line 102b, and an auxiliary capacitance electrode 213a (213b, 213c) that branches from the auxiliary capacitance bus line 110 and that extends in the same direction as the source bus line 103a (103b). The auxiliary capacitance electrode 213a (213b) is formed of a first electrode section 211a (211b) that has an auxiliary capacitance electrode under source bus line configuration, and a second electrode section 212a (212b) that has a π-type auxiliary capacitance electrode configuration. Therefore, according to an aspect of Embodiment 2-2, the aperture ratio can be increased while still adequately suppressing the capacitance of the source bus line.

In the active matrix substrate 201, when a point P2, which is disposed between adjacent pixels on a line that passes through the center of a display region of respective pixels aligned in the horizontal direction, is set as a reference point, adjacent first electrode sections 211a, 211b are disposed symmetrically with respect to the point P2. Adjacent second electrode sections 212a, 212b are also disposed symmetrically with respect to point P2. The first electrode sections 211a, 211b and the second electrode sections 212a, 212b are disposed the same as those in other pixels arranged in the horizontal direction. Consequently, the placement of two regions AR5, AR6 within the display region of the pixel switches between adjacent pixels arranged in the horizontal direction. As a result, the aperture ratios of an upper region ARu and a lower region AR1 in one pixel row are substantially identical, and line-shaped unevenness like that mentioned above can be prevented from occurring. Therefore, according to an aspect of Embodiment 2-2, decreases in display quality can be adequately prevented.

Embodiment 2-3

In Embodiment 2-3, a portion of the second electrode sections of the auxiliary capacitance electrodes have a loop-like structure. In addition, the ratio (the ratio of the length in the direction to which the source bus lines extend) of a first electrode section to a second electrode section of an auxiliary capacitance electrode is 1:3.

Other than the configuration of the auxiliary capacitance electrode, an active matrix substrate and a liquid crystal display device according to Embodiment 2-3 are identical to those of Embodiment 2-1. An explanation of identical parts will therefore not be repeated here.

Figure 6:
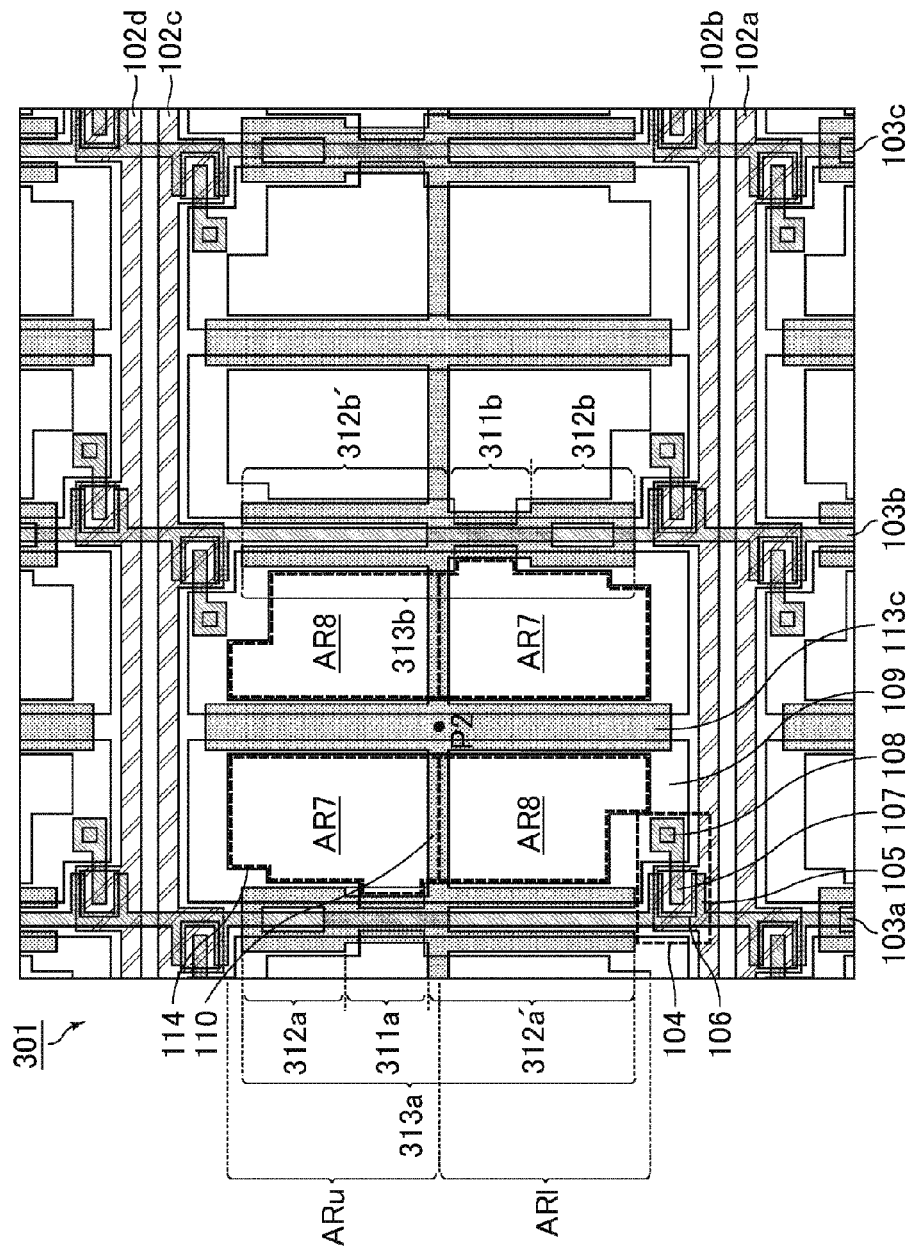
FIG. 6 is schematic plan view that shows a pixel in an active matrix substrate according to Embodiment 2-3.

FIG. 6 is schematic plan view that illustrates a pixel of an active matrix substrate according to Embodiment 2-3. An active matrix substrate 301 includes an auxiliary capacitance bus line 110 that extends in the same direction as a gate bus line 102b, and an auxiliary capacitance electrode 313a (313b, 313c) that branches from the auxiliary capacitance bus line 110 and that extends in the same direction as the source bus line 103a (103b). The auxiliary capacitance electrode 313a (313b) is formed of a first electrode section 311a (311b) that has an auxiliary capacitance electrode under source bus line configuration, and second electrode sections 312a, 312a' (312b, 312b') that have a π-type auxiliary capacitance electrode configuration. Therefore, according to an aspect of Embodiment 2-3, the aperture ratio can be increased while still adequately suppressing the capacitance of the source bus line.

In the active matrix substrate 301, when a point P2, which is disposed between adjacent pixels on a line that passes through the center of a display region of respective pixels aligned in the horizontal direction, is set as a reference point, adjacent first electrode sections 311a, 311b are disposed symmetrically with respect to the point P2. Adjacent second electrode sections 312a, 312b are also disposed symmetrically with respect to point P2. Adjacent second electrode sections 312a', 312b' are also disposed symmetrically with respect to point P2. The first electrode sections 311a, 311b, the second electrode sections 312a, 312b, and the second electrode sections 312a', 312b' are disposed the same as the electrode sections in other pixels arranged in the horizontal direction. Consequently, the placement of two regions AR7, AR8 within the display region of the pixel switches between adjacent pixels arranged in the horizontal direction. As a result, the aperture ratios of an upper region ARu and a lower region AR1 in one pixel row are substantially identical, and line-shaped unevenness like that mentioned above can be prevented from occurring. Therefore, according to an aspect of Embodiment 2-3, decreases in display quality can be adequately prevented.

The second electrode sections 312a, 312b have a loop-like structure in which the ends of the two linear sections are connected to each other. Therefore, as mentioned above, even if a portion of the second electrode section becomes disconnected, the effect of partially blocking an electric field that is generated between the pixel electrode and the source bus line can still be maintained.

Embodiment 2-4

In Embodiment 2-4, all second electrode sections of auxiliary capacitance electrodes have a loop-like structure. In addition, the ratio (the ratio of the length in the direction to which the source bus lines extend) of a first electrode section to a second electrode section of an auxiliary capacitance electrode is 1:2.

Other than the configuration of the auxiliary capacitance electrode, an active matrix substrate and a liquid crystal display device according to Embodiment 2-4 are identical to those of Embodiment 2-1. An explanation of identical parts will therefore not be repeated here.

Figure 7:
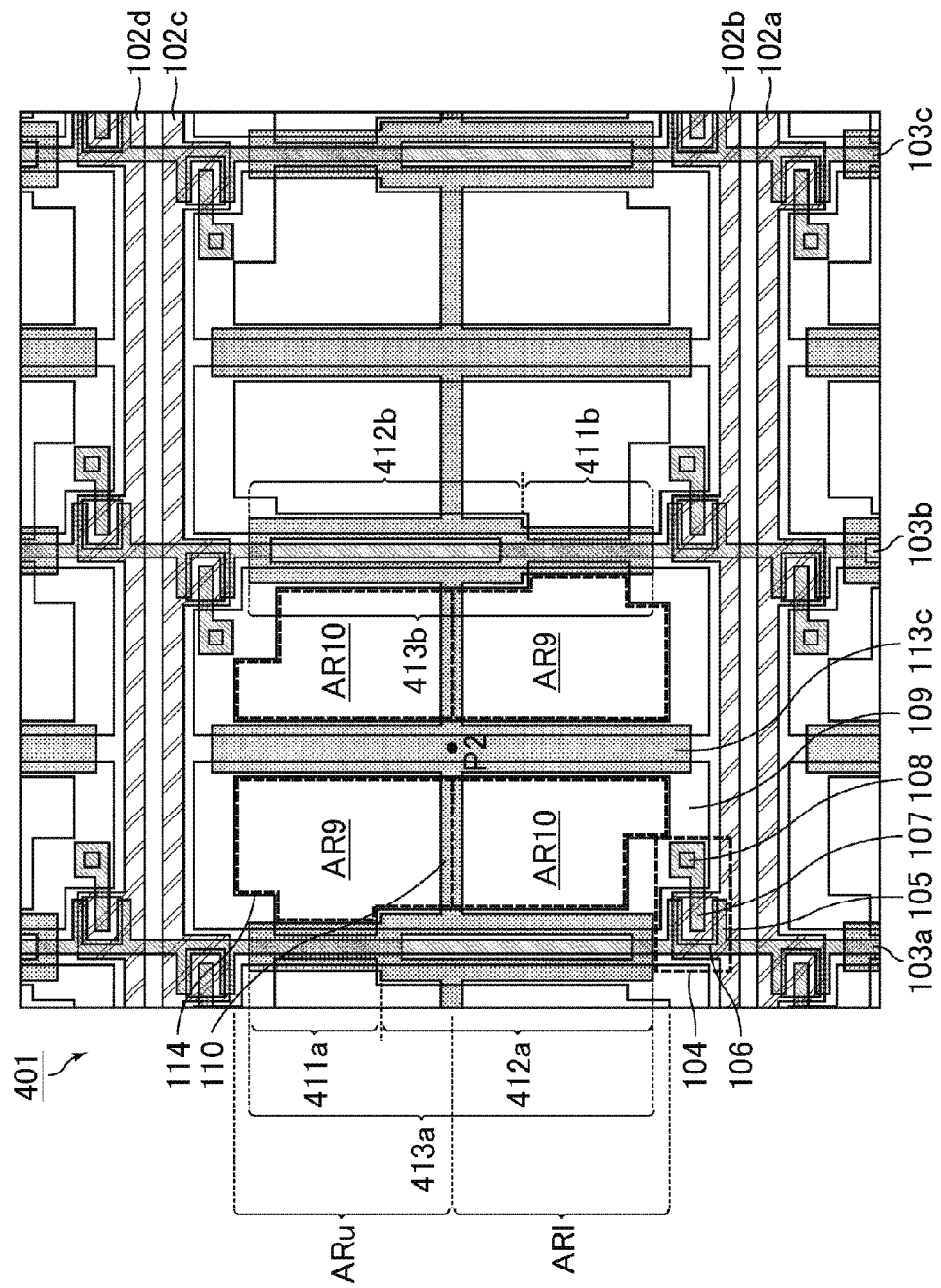
FIG. 7 is schematic plan view that shows a pixel in an active matrix substrate according to Embodiment 2-4.

FIG. 7 is schematic plan view that illustrates a pixel of an active matrix substrate according to Embodiment 2-4. An active matrix substrate 401 includes an auxiliary capacitance bus line 110 that extends in the same direction as a gate bus line 102b, and an auxiliary capacitance electrode 413a (413b, 413c) that branches from the auxiliary capacitance bus line 110 and that extends in the same direction as the source bus line 103a (103b). The auxiliary capacitance electrode 413a (413b) is formed of a first electrode section 411a (411b) that has an auxiliary capacitance electrode under source bus line configuration, and a second electrode section 412a (412b) that has a π-type auxiliary capacitance electrode configuration. Therefore, according to an aspect of Embodiment 2-4, the aperture ratio can be increased while still adequately suppressing the capacitance of the source bus line.

In the active matrix substrate 401, when a point P2, which is disposed between adjacent pixels on a line that passes through the center of a display region of respective pixels aligned in the horizontal direction, is set as a reference point, adjacent first electrode sections 411a, 411b are disposed symmetrically with respect to the point P2. Adjacent second electrode sections 412a, 412b are also disposed symmetrically with respect to point P2. The first electrode sections 411a, 411b and the second electrode sections 412a, 412b are disposed the same as those in other pixels arranged in the horizontal direction. Consequently, the placement of two regions AR9, AR10 within the display region of the pixel switches between adjacent pixels arranged in the horizontal direction. As a result, the aperture ratios of an upper region ARu and a lower region AR1 in one pixel row are substantially identical, and line-shaped unevenness like that mentioned above can be prevented from occurring. Therefore, according to an aspect of Embodiment 2-4, decreases in display quality can be adequately prevented.

The second electrode sections 412a, 412b have a loop-like structure in which the ends of two linear sections are connected to each other. Therefore, as mentioned above, even if a portion of the second electrode section becomes disconnected, the effect of partially blocking an electric field that is generated between the pixel electrode and the source bus line can still be maintained.

As shown in FIGS. 4 to 7, in Embodiments 2-1 to 2-4, the first and second electrode sections are disposed in the same location with respect to the pixel columns in the vertical direction. There are no particular restrictions as to how the sections are disposed, however, and the location of the electrode sections may be switched with each other, for example.

There are no particular limitations regarding liquid crystal display mode, method of alignment, method of driving, and pixel shape for the liquid crystal display devices according to Embodiments 2-1 to 2-4. In addition, since such configurations are the same as those of Embodiment 1, an explanation will not be repeated here.

Embodiment 3

Embodiment 3 has a dual gate configuration in which auxiliary capacitance bus lines are disposed on the periphery of pixels. In Embodiment 3, there are no particular restrictions as to whether or not second electrode sections have a loop-like structure. For example, all of the second electrode sections may have a loop-like structure, none of the second electrode sections may have a loop-like structure, or a portion of the second electrode sections may have a loop-like structure. There is also no particular limit to the ratio (the ratio of the length in the direction to which the source bus lines extend) of the first electrode section to the second electrode section, and the ratio may be set to any desired value in accordance with the pixel size, shape of the pixel electrodes, and any desired specifications (power consumption, display quality, and the like) so that the effect of an aspect of the present invention may be exhibited. More detailed examples will be given in Embodiments 3-1 and 3-2, which will be explained below. Descriptions of a dual gate configuration and a configuration in which the auxiliary capacitance bus lines are disposed on the periphery of the pixels will not be repeated since such descriptions were given above.

Embodiment 3-1

In Embodiment 3-1, second electrode sections of auxiliary capacitance electrodes do not have a loop-like structure. In addition, the ratio (the ratio of the length in the direction to which the source bus lines extend) of a first electrode section to a second electrode section of an auxiliary capacitance electrode is 1:1.

Other than the arrangement of the auxiliary capacitance bus line and the configuration of the auxiliary capacitance electrode, an active matrix substrate and a liquid crystal display device according to Embodiment 3-1 are identical to those of Embodiment 2-1. An explanation of identical parts will therefore not be repeated here.

FIG. 8 is schematic plan view that illustrates a pixel of an active matrix substrate according to Embodiment 3-1. An active matrix substrate 501 includes an auxiliary capacitance bus line 110 that extends in the same direction as a gate bus line 102b, and an auxiliary capacitance electrode 513a (513b, 513c) that branches from the auxiliary capacitance bus line 110 and that extends in the same direction as the source bus line 103a (103b). The auxiliary capacitance electrode 513a (513b) is formed of a first electrode section 511a (511b) that has an auxiliary capacitance electrode under source bus line configuration, and a second electrode section 512a (512b) that has a π-type auxiliary capacitance electrode configuration. Therefore, according to an aspect of Embodiment 3-1, the aperture ratio can be increased while still adequately suppressing the capacitance of the source bus line.

In the active matrix substrate 501, when a point P2, which is disposed between adjacent pixels on a line that passes through the center of a display region of respective pixels aligned in the horizontal direction, is set as a reference point, adjacent first electrode sections 511a, 511b are disposed symmetrically with respect to the point P2. Adjacent second electrode sections 512a, 512b are also disposed symmetrically with respect to point P2. The first electrode sections 511a, 511b and the second electrode sections 512a, 512b are disposed the same as those in other electrodes arranged in the horizontal direction. Consequently, the placement of two regions AR11, AR12 within the display region of the pixel switches between adjacent pixels arranged in the horizontal direction. As a result, the aperture ratios of an upper region ARu and a lower region AR1 in one pixel row are substantially identical, and line-shaped unevenness like that mentioned above can be prevented from occurring. Therefore, according to an aspect of Embodiment 3-1, decreases in display quality can be adequately prevented.

The second electrode section 512a does not have a loop-like structure itself. However, since the second electrode section 512a is electrically connected to the auxiliary capacitance bus line 110, a loop-like structure is formed by combining the second electrode section 512a with the auxiliary capacitance bus line 110. Thus, even if a portion of the second electrode section 512a becomes disconnected, the effect of partially blocking an electric field generated between the pixel electrode and the source bus line can be maintained.

Embodiment 3-2

In Embodiment 3-2, a portion of second electrode sections of auxiliary capacitance electrodes have a loop-like structure. In addition, the ratio (the ratio of the length in the direction to which the source bus lines extend) of a first electrode section to a second electrode section of an auxiliary capacitance electrode is 1:1.

Other than the arrangement of an auxiliary capacitance bus line and the configuration of the auxiliary capacitance electrode, an active matrix substrate and a liquid crystal display device according to Embodiment 3-2 are identical to those of Embodiment 2-1. An explanation of identical parts will therefore not be repeated here.

Figure 9:
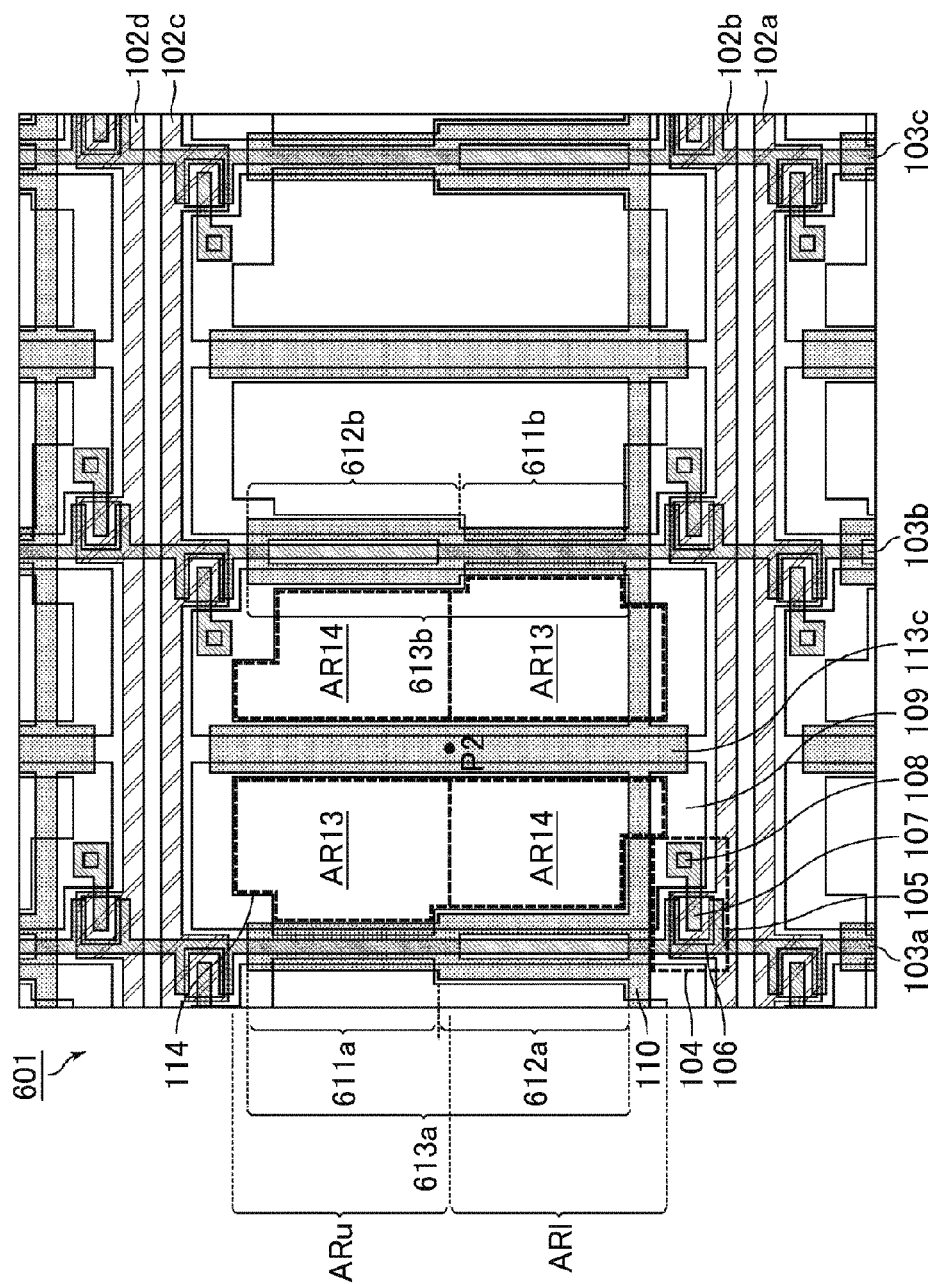
FIG. 9 is schematic plan view that shows a pixel in an active matrix substrate according to Embodiment 3-2.

FIG. 9 is schematic plan view that illustrates a pixel of an active matrix substrate according to Embodiment 3-2. An active matrix substrate 601 includes an auxiliary capacitance bus line 110 that extends in the same direction as a gate bus line 102b, and an auxiliary capacitance electrode 613a (613b, 613c) that branches from the auxiliary capacitance bus line 110 and that extends in the same direction as the source bus line 103a (103b). The auxiliary capacitance electrode 613a (613b) is formed of a first electrode section 611a (611b) that has an auxiliary capacitance electrode under source bus line configuration, and a second electrode section 612a (612b) that has a π-type auxiliary capacitance electrode configuration. Therefore, according to an aspect of Embodiment 3-2, the aperture ratio can be increased while still adequately suppressing the capacitance of the source bus line.

In the active matrix substrate 601, when a point P2, which is disposed between adjacent pixels on a line that passes through the center of the display region of respective pixels aligned in the horizontal direction, is set as a reference point, adjacent first electrode sections 611a, 611b are disposed symmetrically with respect to the point P2. Adjacent second electrode sections 612a, 612b are also disposed symmetrically with respect to the point P2. The first electrode sections 611a, 611b and the second electrode sections 612a, 612b are disposed the same as those in other pixels arranged in the horizontal direction. Consequently, the placement of two regions AR13, AR14 within the display region of the pixel switches between adjacent pixels arranged in the horizontal direction. As a result, the aperture ratios of an upper region ARu and a lower region AR1 in one pixel row are substantially identical, and line-shaped unevenness like that mentioned above can be prevented from occurring. Therefore, according to an aspect of Embodiment 3-2, decreases in display quality can be adequately prevented.

The second electrode section 612b has a loop-like structure in which the ends of two linear sections are connected to each other. Therefore, as mentioned above, even if a portion of the second electrode section becomes disconnected, the effect of partially blocking an electric field that is generated between the pixel electrode and the source bus line can still be maintained.

As shown in FIGS. 8 and 9, in Embodiments 3-1 and 3-2, the first and second electrode sections are disposed in the same location with respect to the pixel columns in the vertical direction. There are no particular restrictions as to how the electrode sections are disposed in the vertical direction, however, and the location of the electrode sections may be switched with each other, for example.

There are no particular limitations regarding liquid crystal display mode, method of alignment, method of driving, and pixel shape for the liquid crystal display devices according to Embodiments 3-1 and 3-2. In addition, since such configurations are the same as those for Embodiment 1, an explanation will not be repeated here.

Embodiment 4

Embodiment 4 has a single scan configuration with an upper and lower individually driven configuration. An auxiliary capacitance bus line is disposed so as to pass through the center of pixels. In addition, the ratio (the ratio of the length in the direction to which the source bus lines extend) of a first electrode section and a second electrode section of an auxiliary capacitance electrode is 1:1.

Other than the arrangement of a thin film transistor element, the arrangement of the auxiliary capacitance bus line, and the configuration of the auxiliary capacitance electrode, an active matrix substrate and a liquid crystal display device according to Embodiment 4 are identical to those of Embodiment 1. An explanation of identical parts will therefore not be repeated here. Description of a configuration in which the auxiliary capacitance bus lines are disposed so as to pass through the center of the pixels will not be repeated since such a description was given above. Thin film transistor elements 4a, 4b such as those shown in FIG. 10 correspond to the thin film transistor element 4 of Embodiment 1.

Figure 10:
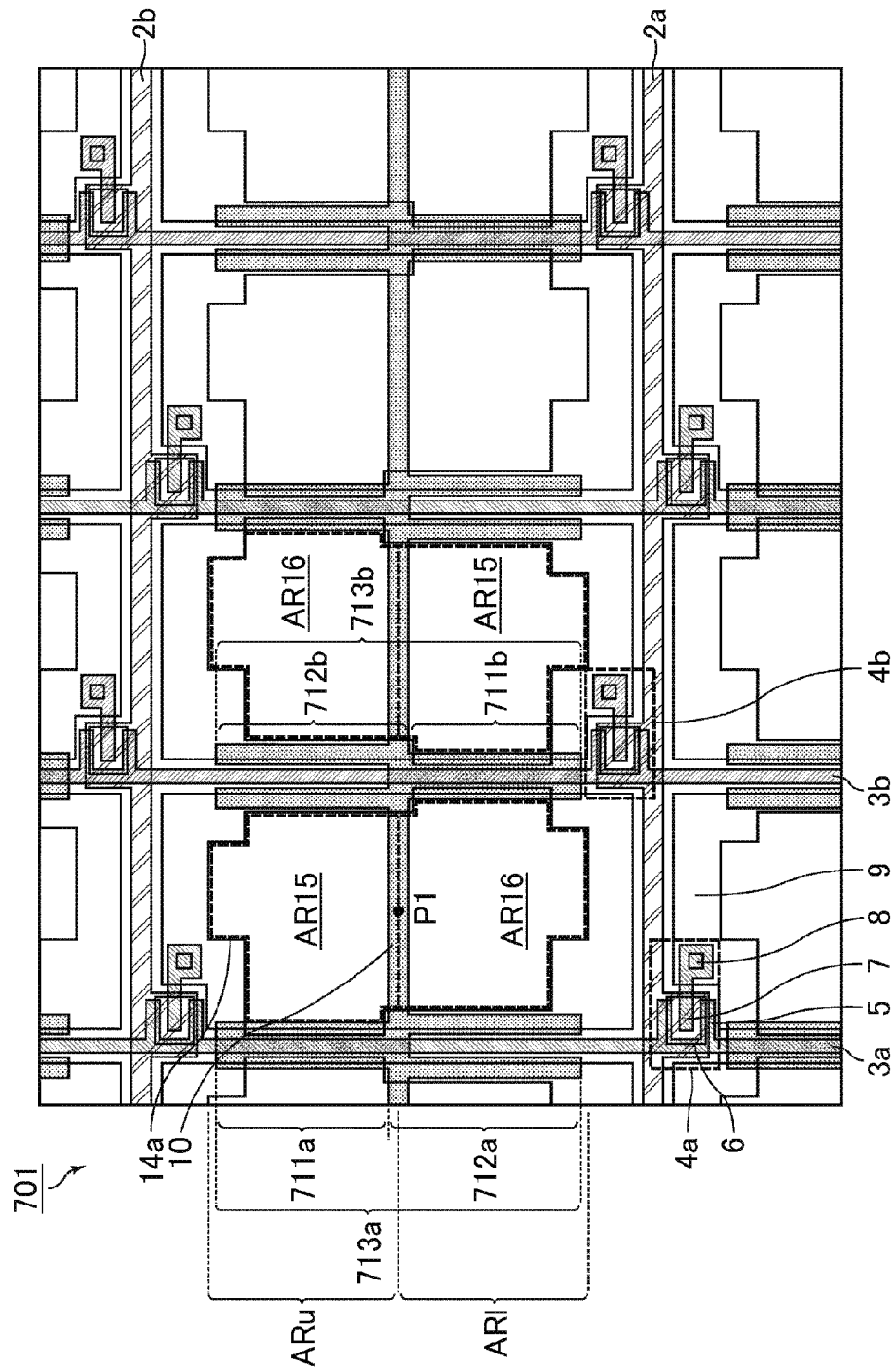
FIG. 10 is schematic plan view that shows a pixel in an active matrix substrate according to Embodiment 4.

FIG. 10 is schematic plan view that illustrates a pixel of an active matrix substrate according to Embodiment 4. An active matrix substrate 701 includes an auxiliary capacitance bus line 10 that extends in the same direction as a gate bus line 2a, and an auxiliary capacitance electrode 713a (713b) that branches from the auxiliary capacitance bus line 10 and that extends in the same direction as a source bus line 3a (3b). The auxiliary capacitance electrode 713a (713b) is formed of a first electrode section 711a (711b) that has an auxiliary capacitance electrode under source bus line configuration, and a second electrode section 712a (712b) that has a π-type auxiliary capacitance electrode configuration. Therefore, according to an aspect of Embodiment 4, the aperture ratio can be increased while still adequately suppressing the capacitance of the source bus line.

In the active matrix substrate 701, when a point P1, which is disposed in the center of a display region of a pixel, is set as a reference point, adjacent first electrode sections 711a, 711b are disposed symmetrically with respect to the point P1. Adjacent second electrode sections 712a, 712b are also disposed symmetrically with respect to point P1. The first electrode sections 711a, 711b and the second electrode sections 712a, 712b are disposed the same as those in other pixels arranged in the horizontal direction. Consequently, the placement of two regions AR15, AR16 within the display region of the pixel switches between adjacent pixels arranged in the horizontal direction. As a result, the aperture ratios of an upper region ARu and a lower region AR1 in one pixel row are substantially identical, and line-shaped unevenness like that mentioned above can be prevented from occurring. Therefore, according to an aspect of Embodiment 4, decreases in display quality can be adequately prevented.

Figure 11:
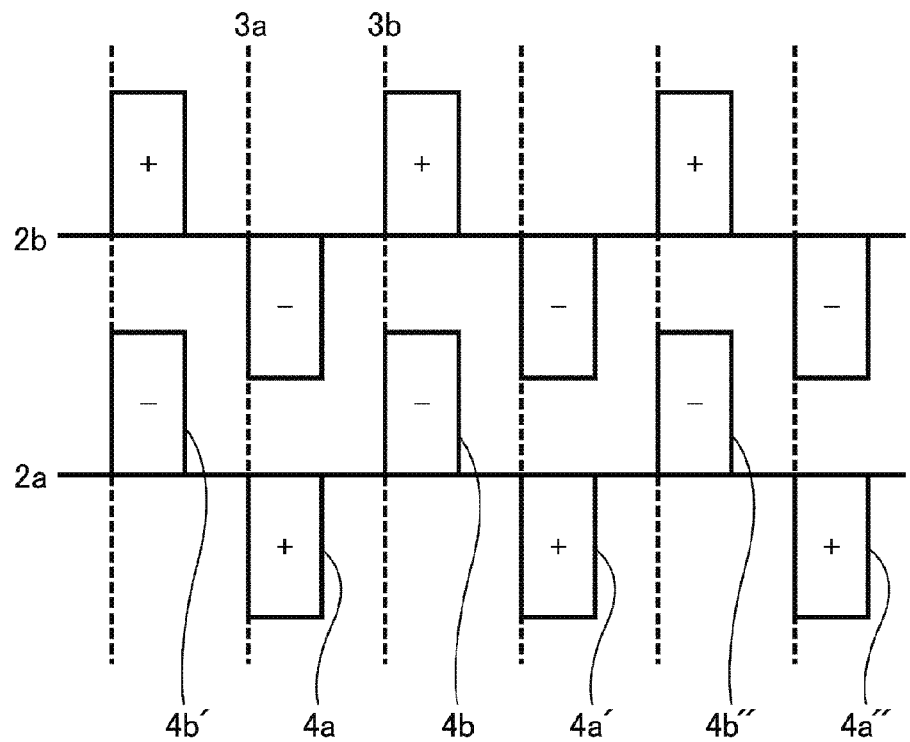
FIG. 11 illustrates a method for driving the active matrix substrate according to Embodiment 4.

Next, the upper and lower individually driven configuration will be explained using FIG. 11. FIG. 11 illustrates a method for driving the active matrix substrate according to Embodiment 4. In FIG. 11, the solid lines extending in the horizontal direction represent the gate bus lines, and the dotted lines extending in the vertical direction represent the source bus lines. In addition, in FIG. 11, the symbols "+" (plus) and "−" (minus) represent the polarity of voltage output from a source driver, for example. The source driver inputs image signals into the thin film transistor elements via the source bus lines.

As mentioned above, an upper and lower individually driven configuration is a configuration in which, in an active matrix substrate such as the one shown in FIG. 11, upper and lower halves of all pixels (pixels corresponding to the thin film transistor elements 4a, 4a', 4a", 4b, 4b', 4b", for example) disposed on both sides of the gate bus line 2a are individually driven, for example. The same occurs for any other gate bus lines (gate bus line 2b, for example) as well. Looking at the polarity of the voltage output by the source driver, as shown in FIG. 11, dot inversion driving, which reverses the polarity of each of the pixels disposed along the same source bus line, is used. By using an upper and lower individually driven configuration, the pixels aligned in the direction to which the gate bus lines extend will all have the same polarity, and the pixels can thus be put into a state similar to the state of pixels in a configuration in which line inversion driving causes the polarity of all pixels in the horizontal direction to become inverted. Therefore, domains can be prevented from occurring on the source bus lines.

Similar to Embodiment 1, Embodiment 4 has a configuration, as shown in FIG. 10, in which second electrode sections that oppose a black matrix that is relatively wide are not continuously arranged in the horizontal direction. Thus, distance in the horizontal direction between second electrode sections can be adequately maintained, the margin of the resolution limit between the black matrix is increased, and it becomes easier to form a black matrix with high precision. As a result, Embodiment 4 can be suitably applied to a high resolution liquid crystal display device in which the size of the pixels is small (the pixel pitch in the horizontal direction is small). In addition, the thin film transistor elements are not continuously arranged in the horizontal direction; thus, Embodiment 4 can be suitably applied to a high definition liquid crystal display device in which the pixel pitch is smaller.

In Embodiment 4, the auxiliary capacitance bus line is disposed so as to pass through the center of pixels. There are no restrictions as to where the auxiliary capacitance bus line is disposed, however, and the auxiliary capacitance bus line may be disposed on the periphery of the pixels, for example.

In Embodiment 4, the second electrode sections do not have a loop-like structure, but there are no particular restrictions as to whether or not the second electrode sections have a loop-like structure. For example, all of the second electrode sections may have a loop-like structure, none of the loop second electrode sections may have a loop-like structure, or a portion of the second electrode sections may have a loop-like structure.

In Embodiment 4, the ratio (ratio of the length in the direction to which the source bus lines extend) of the first electrode sections to the second electrode sections is 1:1. There is no particular limit to this ratio, however, and the ratio may be set to any desired value in accordance with the pixel size, shape of the pixel electrodes, any desired specifications (power consumption, display quality, and the like) and the like so that the effect of an aspect of the present invention may be exhibited.

As shown in FIG. 10, in Embodiment 4, the first and second electrode sections are disposed in the same location with respect the pixel columns in the vertical direction. There are no particular restrictions as to how the electrode sections are disposed in the vertical direction, however, and the location of the electrode sections may be switched with each other, for example.

There are no particular limitations regarding liquid crystal display mode, method of alignment, method of driving, and pixel shape for the liquid crystal display device according to Embodiment 4. In addition, since such configurations are the same as those for Embodiment 1, an explanation will not be repeated here.

Evaluation Results

Figure 12:
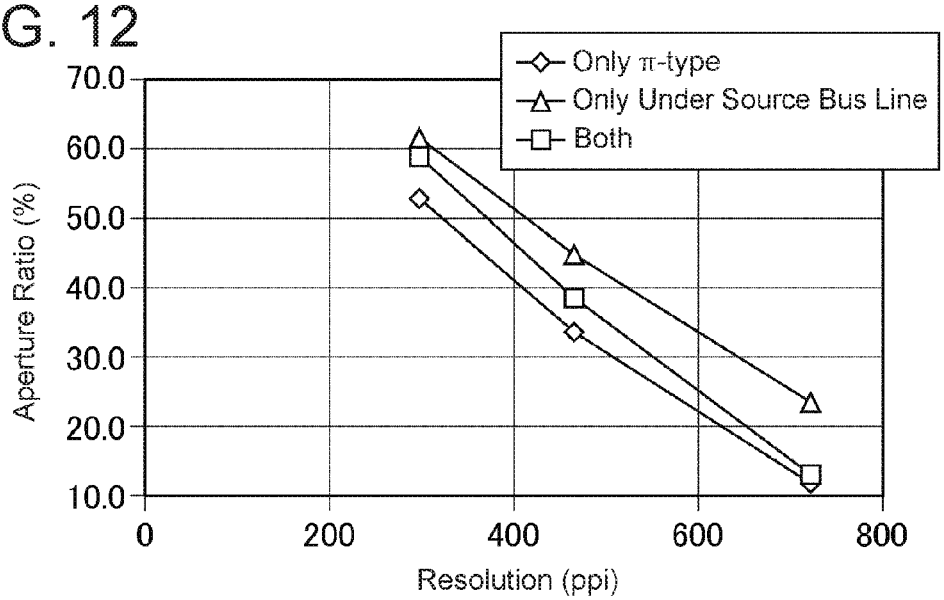
FIG. 12 is a graph that shows aperture ratios of liquid crystal display devices according to Embodiment 2-1.
Figure 13:
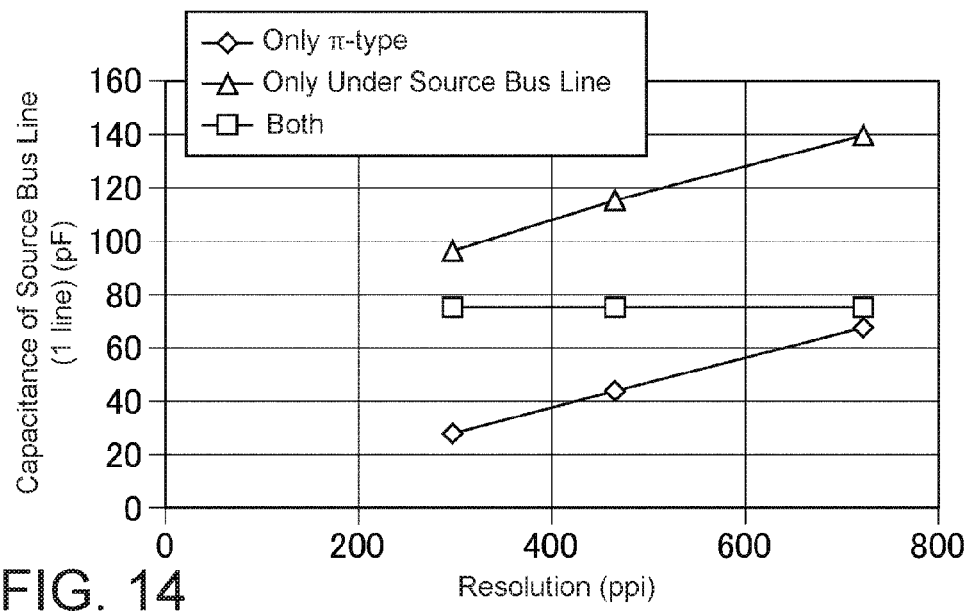
FIG. 13 is a graph that shows the capacitance of the source bus lines in liquid crystal display devices according to Embodiment 2-1.
Figure 14:
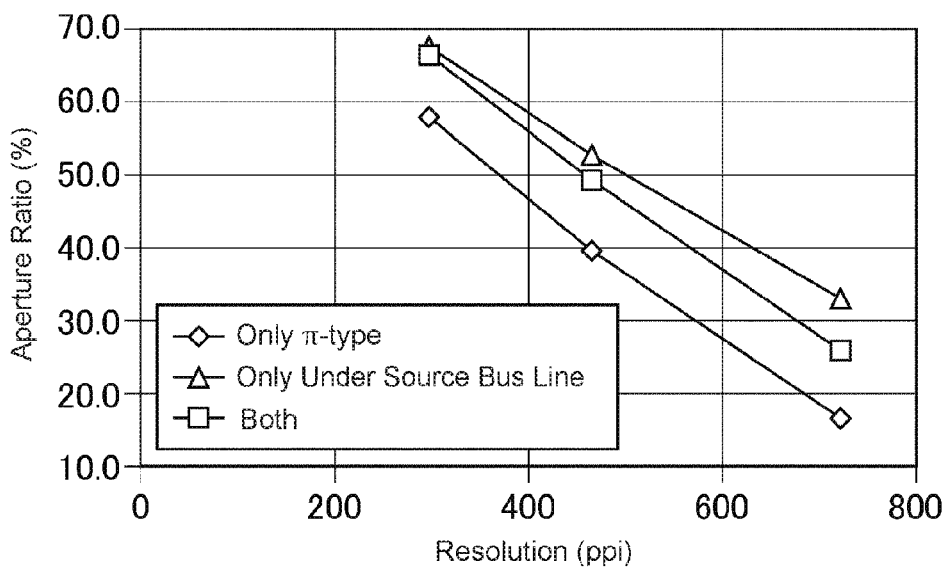
FIG. 14 is a graph that shows the aperture ratios of liquid crystal display devices according to Embodiment 4.
Figure 15:
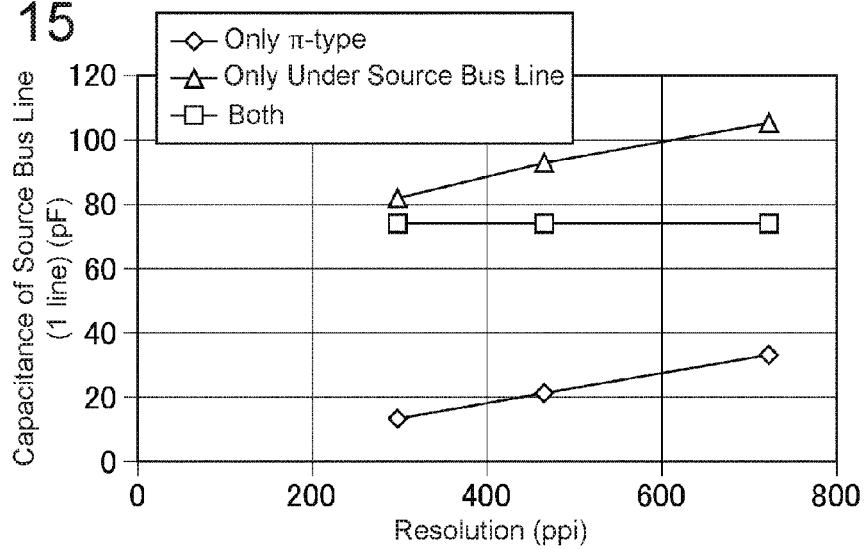
FIG. 15 is a graph that shows the capacitance of the source bus lines in liquid crystal display devices according to Embodiment 4.
Figure 16:
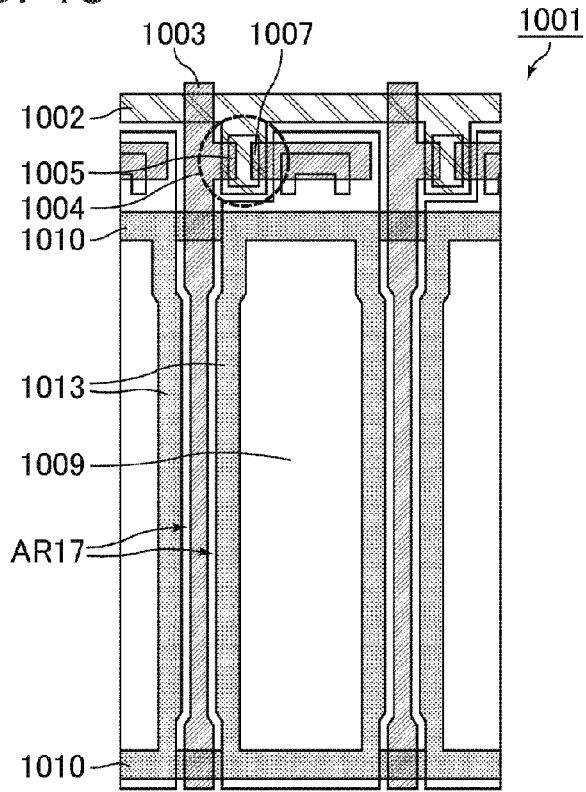
FIG. 16 is a schematic plan view that shows a pixel in a conventional active matrix substrate (a π-type auxiliary capacitance electrode configuration).
Figure 17:
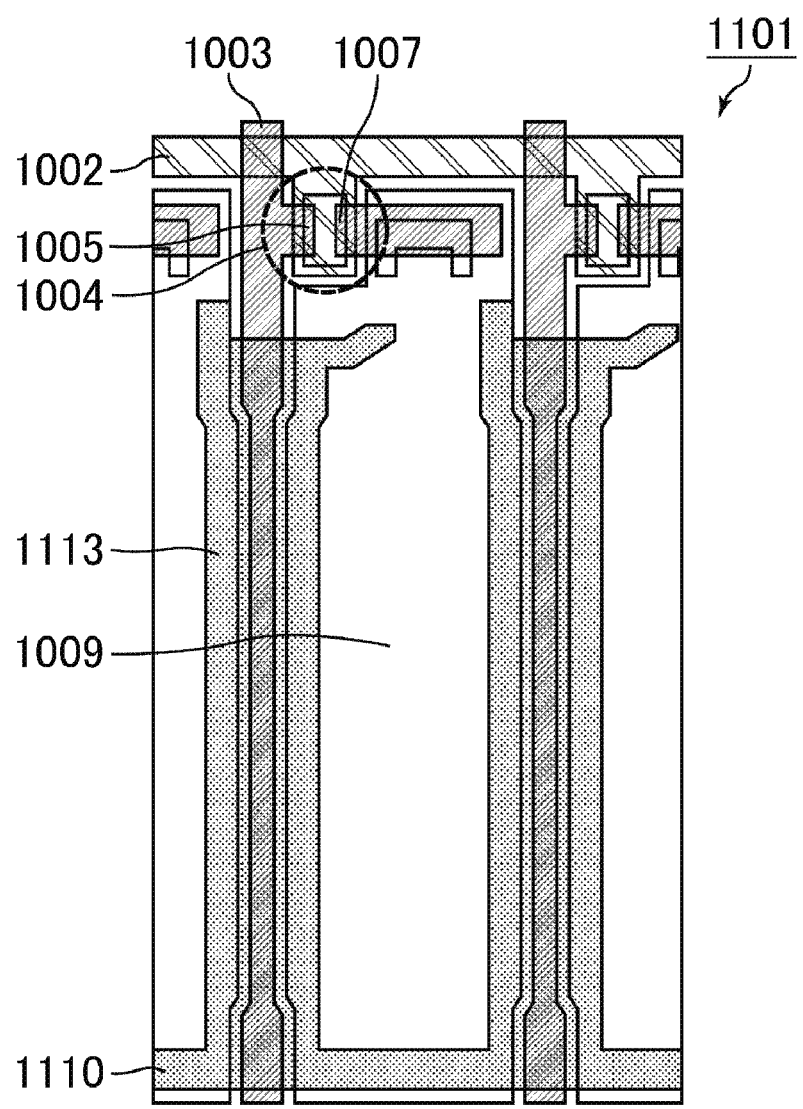
FIG. 17 is a schematic plan view of a pixel in a conventional active matrix substrate (an auxiliary capacitance electrode under source bus line configuration).
Figure 18:
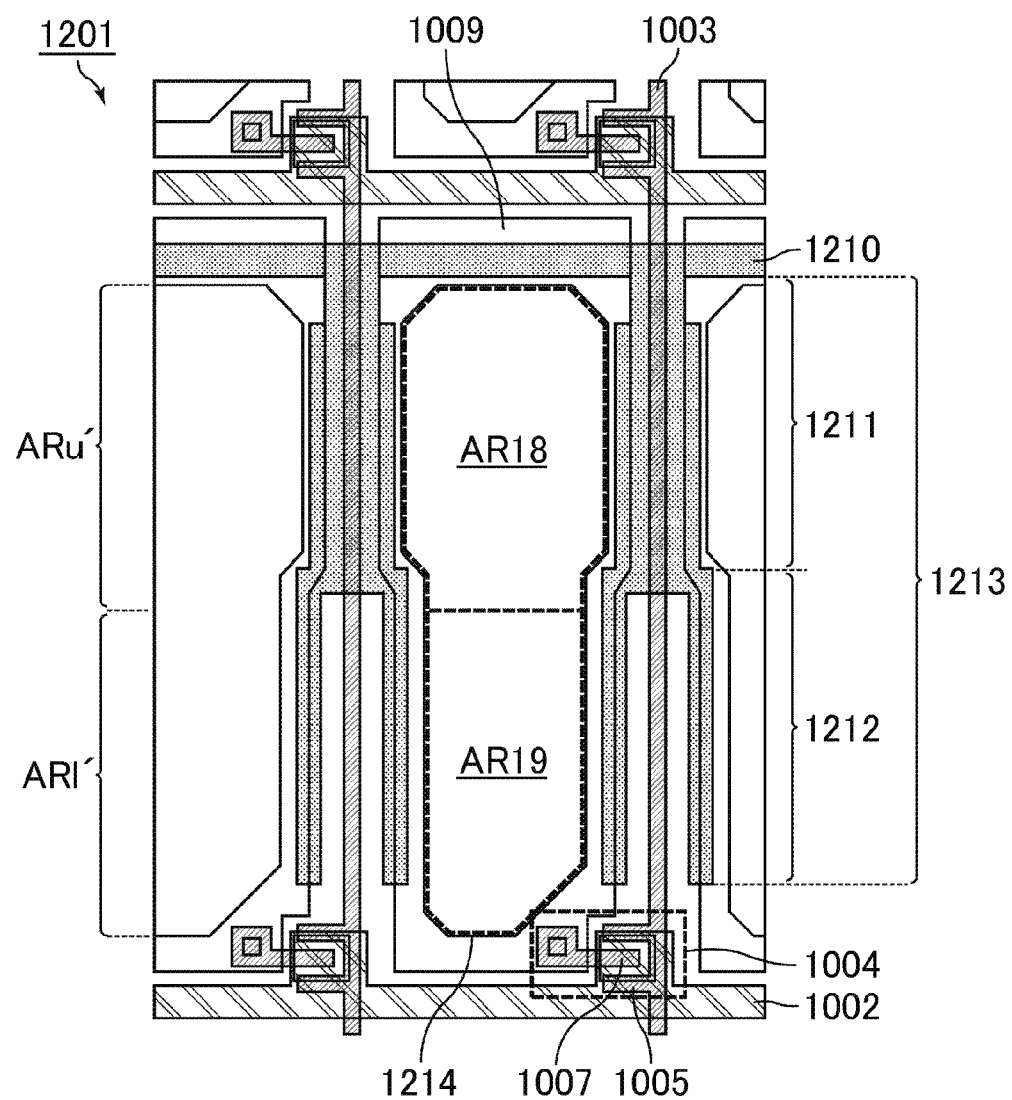
FIG. 18 is a schematic plan view of a pixel in a conventional active matrix substrate (a combination of a π-type auxiliary capacitance electrode configuration and an auxiliary capacitance electrode under source bus line configuration).

Various data for liquid crystal display devices according to Embodiments 2-1 and 4 are displayed in Table 1. Aperture ratios and source bus line capacitance (for one line) for liquid crystal display devices according to Embodiments 2-1 and 4 are displayed in Table 2. The aperture ratio and source bus line capacitance have been calculated separately for three cases which each have a different resolution (ppi: pixels per inch). FIGS. 12 to 15 display the contents of Tables 1 and 2 in graph form. FIG. 12 is a graph that shows the aperture ratios of liquid crystal display devices according to Embodiment 2-1. FIG. 13 is a graph that shows the capacitance of source bus lines in liquid crystal display devices according to Embodiment 2-1. FIG. 14 is a graph that shows aperture ratios of liquid crystal display devices according to Embodiment 4. FIG. 15 is a graph that shows the capacitance of source bus lines in liquid crystal display devices according to Embodiment 4. In Table 2 and FIGS. 12 to 15, data for cases in which the configuration (described as "both") of the auxiliary capacitance electrodes from Embodiments 2-1 and 4 has been changed to just a π-type auxiliary capacitance electrode configuration (described as "only π-type") and instances in which the configuration has been changed to just an auxiliary capacitance electrode under source bus line configuration (described as "only under source bus line") are shown. In addition, the capacitance of the source bus lines was calculated under the assumption that the specification was 74 pF.

TABLE 1

| | Case | Resolution (ppi) | Screen Size (inches) | Number of Pixels (individual pixels) | | Pixel Pitch (μM) | |
| | | | | Horizontal | Vertical | Short Side | Long Side |
| --- | --- | --- | --- | --- | --- | --- | --- |
| Embodiment 2-1 | 1 | 297 | 6.3 | 1800 | 480 | 69 | 207 |
| | 2 | 465 | 6.8 | 3072 | 768 | 45 | 135 |
| | 3 | 722 | 6.9 | 4800 | 1200 | 29 | 87 |
| Embodiment 4 | 1 | 297 | 6.3 | 1800 | 480 | 69 | 207 |
| | 2 | 465 | 6.8 | 3072 | 768 | 45 | 135 |
| | 3 | 722 | 6.9 | 4800 | 1200 | 29 | 87 |

TABLE 2

| | | Aperture Ratio (%) | | | Source Bus Line Capacitance Per Line (pF) | | |
| | Case | Both | Only π-type | Only Under Source Bus Line | Both | Only π-type | Only Under Source Bus Line |
| --- | --- | --- | --- | --- | --- | --- | --- |
| Embodiment 2-1 | 1 | 58.8 | 52.8 | 61.6 | 74 | 27 | 95 |
| | 2 | 38.5 | 33.6 | 44.8 | 74 | 42 | 114 |
| | 3 | 13.0 | 11.7 | 23.5 | 74 | 66 | 138 |
| Embodiment 4 | 1 | 66.3 | 57.8 | 67.4 | 74 | 13 | 82 |
| | 2 | 49.2 | 39.5 | 52.7 | 74 | 21 | 93 |
| | 3 | 25.8 | 16.5 | 33.0 | 74 | 33 | 105 |

The evaluation results of the various examples will be explained below.

Embodiment 2-1

As shown in FIGS. 12 and 13, the aperture ratio was larger than in examples that only had a π-type auxiliary capacitance electrode configuration, and the source bus line capacitance was smaller than in examples that only had an auxiliary capacitance electrode under source bus line configuration. Therefore, according to an aspect of Embodiment 2-1, the aperture ratio can be increased while still adequately suppressing the capacitance of the source bus line.

Embodiment 4

As shown in FIGS. 14 and 15, the aperture ratio was larger than in examples that only had a π-type auxiliary capacitance electrode configuration, and the source bus line capacitance was smaller than in examples that only had an auxiliary capacitance electrode under source bus line configuration. Therefore, according to an aspect of Embodiment 4, the aperture ratio can be increased while still adequately suppressing the capacitance of the source bus line. In addition, the aperture ratio of Embodiment 4 was larger than that of Embodiment 2-1, and, as was mentioned above, it can be seen that Embodiment 4 is suitable for high definition liquid crystal display devices in which the pixel pitch is small.

It can be surmised that other embodiments would have results similar to those shown above. For example, in Embodiments 2-1 to 2-4, 3-1, and 3-2, the auxiliary capacitance bus lines have the same amount of surface area in the display region of the pixels regardless of whether the auxiliary capacitance bus lines are disposed so as to pass through the center of the pixels or disposed on the periphery of the pixels. Therefore, it can be surmised that the effect on the aperture ratio would be the same for each embodiment. In addition, regardless of whether or not the second electrode sections have a loop-like structure, the width of the black matrix that opposes the source bus lines and the second electrode sections remains the same. Therefore, it can be surmised that the effect on the aperture ratio would be the same for each embodiment. Therefore, according to an aspect of Embodiments 2-1 to 2-4, 3-1, and 3-2, the aperture ratio can be increased while still adequately suppressing the capacitance of the source bus lines.

Also, in Embodiments 1 and 4, since changing the arrangement of the thin film transistor elements only causes the alignment of the pixels to be different, it can be surmised that the effect on the aperture ratio would be the same for each embodiment, for example. Therefore, according to an aspect of Embodiments 1 and 4, the aperture ratio can be increased while still adequately suppressing the capacitance of the source bus lines.

DESCRIPTION OF REFERENCE CHARACTERS 1, 101, 201, 301, 401, 501, 601, 701, 1001, 1101, 1201 active matrix substrate
2a, 2b, 102a, 102b, 102c, 102d, 1002 gate bus line
3a, 3b, 103a, 103b, 103c, 1003 source bus line
4, 4a, 4a', 4a", 4b, 4b', 4b", 104, 1004 thin film transistor element
5, 105, 1005 source electrode
6, 106 semiconductor layer
7, 107, 1007 drain electrode
8, 108 contact hole
9, 109, 1009 pixel electrode
10, 110, 1010, 1110, 1210 auxiliary capacitance bus line
11a, 11b, 111a, 111b, 211a, 211b, 311a, 311b, 411a, 411b, 511a, 511b, 611a, 611b, 711a, 711b, 1211 first electrode section
12a', 12b, 112a, 112b, 212a, 212b, 312a, 312a', 312b, 312b', 412a, 412b, 512a, 512b, 612 a, 612b, 712a, 712b, 1212 second electrode section
13a, 13b, 113a, 113b, 11b, 213a, 213b, 313a, 313b, 413a, 413b, 513a, 513b, 613a, 613b, 713a, 713b, 1013, 1113, 1213 auxiliary capacitance electrode
14, 14a, 14b, 114, 1214 black matrix (outside of the section surrounded by the solid line)
15a, 15b glass substrate
16a, 16b protective film
17 insulating film
18a, 18b alignment film
19 color filter
20 opposing substrate
21 liquid crystal layer

What is claimed is:

1. An active matrix substrate, comprising:
   a substrate;
   a plurality of gate bus lines that extend in a first direction on the substrate;
   a plurality of source bus lines that extend in a second direction that intersects said first direction on the substrate;
   a plurality of thin film transistors on the substrate that are respectively electrically connected to said plurality of gate bus lines and said plurality of source bus lines;
   a plurality of pixel electrodes on the substrate that are respectively electrically connected to drain electrodes of the plurality of thin film transistors and that are arranged in a matrix in the first and second directions; and,
   a plurality of an auxiliary capacitance bus lines that extend in said first direction,
   wherein at least one of the plurality of auxiliary capacitance bus lines has at least two auxiliary capacitance electrodes,
   wherein each of said at least two auxiliary capacitance electrodes includes a first electrode section and a second electrode section,
   wherein, in each of said at least two auxiliary capacitance electrodes, at least a portion of said first electrode section overlaps one of said plurality of source bus lines,
   wherein, in each of said at least two auxiliary capacitance electrodes, said second electrode section has two linear sections extending in said second direction, and at least a portion of a region between said two linear sections overlaps said one of said plurality of source bus lines, and
   wherein, in said at least one of the plurality of auxiliary capacitance bus lines, with respect to adjacent two of said at least two auxiliary capacitance electrodes, positions of said first electrode section and second electrode section in the second direction are alternated so as to be generally point-symmetric about a reference point on a straight line that passes through a central region of pixels arranged in the first direction along said at least one of the plurality of auxiliary capacitance bus lines.

2. The active matrix substrate according to claim 1, wherein said at least two auxiliary capacitance electrodes are disposed in a same layer as said plurality of gate bus lines.

3. The active matrix substrate according to claim 1, further comprising an insulating film disposed between said plurality of source bus lines and said plurality of pixel electrodes,
   wherein said insulating film is an inorganic insulating film.

4. The active matrix substrate according to claim 1, further comprising an insulating film disposed between said plurality of source bus lines and said plurality of pixel electrodes,
   wherein said insulating film is an organic insulating film.

5. The active matrix substrate according to claim 1, further comprising an insulating film disposed between said plurality of source bus lines and said plurality of pixel electrodes,
   wherein said insulating film includes an inorganic insulating film and an organic insulating film that are stacked together.

6. The active matrix substrate according to claim 1,
   wherein one of said plurality of gate bus lines is disposed in each row of said plurality of pixel electrodes arranged in the first direction, and
   wherein one of said plurality of source bus lines is disposed in each column of said plurality of pixel electrodes arranged in the second direction.

7. The active matrix substrate according to claim 6, wherein said reference point is located in a center of a pixel.

8. The active matrix substrate according to claim 1,
   wherein two of said plurality of gate bus lines are disposed in each row of said plurality of pixel electrodes arranged in the first direction, and wherein one of said plurality of source bus lines is disposed in every other column of said plurality of pixel electrodes arranged in the second direction.

9. The active matrix substrate according to claim 8, wherein said reference point is located between adjacent two pixels.

10. The active matrix substrate according to claim 1, wherein each of the plurality of gate bus lines have a group of thin film transistors attached thereto, and every adjacent two of said group of said thin film transistors are disposed on respective opposite sides of the gate bus line.

11. The active matrix substrate according to claim 1, wherein said plurality of auxiliary capacitance bus lines are disposed so as to pass through centers of a row of pixels that are arranged in the first direction.

12. The active matrix substrate according to claim 1, wherein said plurality of auxiliary capacitance bus lines are disposed on a periphery of a row of pixels that are arranged in the first direction.

13. The active matrix substrate according to claim 1, wherein said second electrode section has a loop-like structure in which ends of said two linear sections are connected to each other.

14. The active matrix substrate according to claim 1, wherein said plurality of thin film transistors have a semiconductor layer that includes an oxide semiconductor.

15. A display device, comprising:
the active matrix substrate according to claim 1.

16. The active matrix substrate according to claim 14, wherein said oxide semiconductor includes indium, gallium, zinc, and oxygen.

* * * * *